(12) United States Patent
Yamamoto et al.

(10) Patent No.: US 8,675,811 B2
(45) Date of Patent: Mar. 18, 2014

(54) SEMICONDUCTOR DEVICE AND DISPLAY DEVICE

(75) Inventors: Etsuo Yamamoto, Osaka (JP); Yasushi Sasaki, Osaka (JP); Yuhichiroh Murakami, Osaka (JP); Shige Furuta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 962 days.

(21) Appl. No.: 12/734,595

(22) PCT Filed: Aug. 20, 2008

(86) PCT No.: PCT/JP2008/064782
§ 371 (c)(1),
(2), (4) Date: May 11, 2010

(87) PCT Pub. No.: WO2009/084269
PCT Pub. Date: Jul. 9, 2009

(65) Prior Publication Data
US 2010/0309184 A1   Dec. 9, 2010

(30) Foreign Application Priority Data

Dec. 28, 2007   (JP) ................. 2007-339354

(51) Int. Cl.
*G11C 19/00*   (2006.01)

(52) U.S. Cl.
USPC ............... 377/64; 377/68; 377/69; 327/391; 327/436; 327/437

(58) Field of Classification Search
None
See application file for complete search history.

(56) References Cited

U.S. PATENT DOCUMENTS

| | | | |
|---|---|---|---|
| 3,675,043 | A | 7/1972 | Bell |
| 4,716,303 | A | 12/1987 | Mimoto |
| 5,337,173 | A | 8/1994 | Atsumi et al. |
| 5,694,061 | A | 12/1997 | Morosawa |
| 5,701,136 | A | 12/1997 | Huq |

(Continued)

FOREIGN PATENT DOCUMENTS

| | | |
|---|---|---|
| CN | 1782834 | 6/2006 |
| CN | 1825415 | 8/2006 |

(Continued)

OTHER PUBLICATIONS

Office Action for co-pending U.S. Appl. No. 12/734,363 dated Feb. 21, 2013.

(Continued)

*Primary Examiner* — Tuan T Lam
(74) *Attorney, Agent, or Firm* — Harness, Dickey & Pierce, P.L.C.

(57) ABSTRACT

A circuit which is constituted by a plurality of n-channel transistors includes, in at least one embodiment, a transistor (T1) which has a drain terminal to which an input signal is supplied and a source terminal from which a output signal is supplied; and a transistor (T2) which has a drain terminal to which a control signal is supplied and a source terminal connected to a gate terminal of the transistor (T1). A gate terminal of the transistor (T2) is connected to the source terminal of the transistor (T2). With the arrangement, it is possible to provide (i) a semiconductor device which is constituted by transistors having an identical conductivity type and which is capable of reducing an influence of noise, and (ii) a display device including the semiconductor device.

1 Claim, 19 Drawing Sheets

(56) References Cited

U.S. PATENT DOCUMENTS

| | | |
|---|---|---|
| 5,872,481 A | 2/1999 | Sevic et al. |
| 5,949,398 A | 9/1999 | Kim |
| 5,974,041 A | 10/1999 | Kornfeld et al. |
| 6,052,426 A * | 4/2000 | Maurice .................. 377/78 |
| 6,064,713 A * | 5/2000 | Lebrun et al. .............. 377/67 |
| 6,137,315 A | 10/2000 | Zettler |
| 6,198,342 B1 | 3/2001 | Kawai |
| 6,225,866 B1 | 5/2001 | Kubota |
| 6,522,187 B1 * | 2/2003 | Sousa .................. 327/391 |
| 7,176,746 B1 | 2/2007 | Wang et al. |
| 7,518,407 B2 | 4/2009 | Nonaka |
| 7,817,770 B2 * | 10/2010 | Chang et al. ............. 377/64 |
| 7,983,379 B2 * | 7/2011 | Ieong et al. ............. 377/64 |
| 8,031,160 B2 * | 10/2011 | Chen et al. .............. 345/100 |
| 8,059,780 B2 * | 11/2011 | Wang et al. ............. 377/64 |
| 8,497,833 B2 | 7/2013 | Park |
| 2002/0084969 A1 | 7/2002 | Ozawa |
| 2002/0167054 A1 | 11/2002 | Chang et al. |
| 2004/0141273 A1 | 7/2004 | Le |
| 2004/0155242 A1 | 8/2004 | Segawa et al. |
| 2004/0253781 A1 | 12/2004 | Kimura |
| 2005/0122087 A1 | 6/2005 | Sakai |
| 2005/0156858 A1 | 7/2005 | Ahn et al. |
| 2005/0220263 A1 | 10/2005 | Moon |
| 2006/0001637 A1 * | 1/2006 | Pak et al. ............. 345/100 |
| 2006/0061385 A1 | 3/2006 | Jinta et al. |
| 2006/0103429 A1 | 5/2006 | Nonaka |
| 2006/0132418 A1 | 6/2006 | Morita |
| 2006/0152460 A1 | 7/2006 | Toyozawa et al. |
| 2006/0187164 A1 | 8/2006 | Okuno |
| 2006/0208991 A1 | 9/2006 | Uekuri et al. |
| 2006/0227096 A1 | 10/2006 | Fujita |
| 2007/0109288 A1 | 5/2007 | Kida |
| 2007/0132686 A1 * | 6/2007 | Kimura et al. ............ 345/87 |
| 2007/0188431 A1 | 8/2007 | Sato |
| 2007/0195920 A1 | 8/2007 | Tobita |
| 2007/0217564 A1 | 9/2007 | Tobita |
| 2008/0056430 A1 * | 3/2008 | Chang et al. ............ 377/64 |
| 2008/0062071 A1 | 3/2008 | Jeong |
| 2008/0101529 A1 * | 5/2008 | Tobita .................. 377/64 |
| 2008/0218620 A1 | 9/2008 | Atlas et al. |
| 2009/0310734 A1 | 12/2009 | Umezaki |
| 2012/0044132 A1 | 2/2012 | Koga et al. |
| 2012/0170707 A1 * | 7/2012 | Hsu et al. ............... 377/79 |
| 2012/0294411 A1 | 11/2012 | Duan |

FOREIGN PATENT DOCUMENTS

| | | |
|---|---|---|
| CN | 101038792 | 9/2007 |
| EP | 1 199 802 | 4/2002 |
| EP | 1 600 935 | 11/2005 |
| EP | 1 724 784 | 11/2006 |
| EP | 1 780 583 | 5/2007 |
| EP | 1 860 639 | 11/2007 |
| JP | 07-283662 | 10/1995 |
| JP | 08-023238 | 1/1996 |
| JP | 08-263028 | 10/1996 |
| JP | 09-246936 | 9/1997 |
| JP | 10-039277 | 2/1998 |
| JP | 3092506 | 9/2000 |
| JP | 2001-083943 | 3/2001 |
| JP | 2004-222256 | 8/2004 |
| JP | 2005-092783 | 4/2005 |
| JP | 2006-127751 | 5/2006 |
| JP | 2006-148269 | 6/2006 |
| JP | 2006-178072 | 7/2006 |
| JP | 2006-220947 | 8/2006 |
| JP | 2006-277789 | 10/2006 |
| JP | 2006-313319 | 11/2006 |
| JP | 2007-047703 | 2/2007 |
| RU | 2 175 809 | 11/2001 |
| RU | 2 221 286 | 1/2004 |
| WO | WO 2009/034749 | 3/2009 |
| WO | WO 2009/034750 | 3/2009 |
| WO | WO 2009/084267 | 7/2009 |
| WO | WO 2009/084271 | 7/2009 |

OTHER PUBLICATIONS

Office Action for co-pending U.S. Appl. No. 12/734,376 dated Mar. 7, 2013.

Abstract of JP 9246936 published on Sep. 19, 1997.

Noticve of Allowance for corresponding Russian patent application No. 20100123377 mailed Jul. 15, 2011 (with English translation).

Notice of Allowance for co-pending U.S. Appl. No. 12/734,044 dated Nov. 13, 2012.

Office Action for co-pending U.S. Appl. No. 12/734,044 dated Dec. 7, 2011.

Office Action for corrresponding U.S. Appl. No. 12/734,044 dated Apr. 13, 2012.

Advisory Action for corresponding U.S. Appl. No. 12/734,044 dated Jul. 13, 2012.

Notice of Allowance for co-pending U.S. Appl. No. 12/734,363 dated May 31, 2013.

Notice of Allowance for co-pending U.S. Appl. No. 12/734,376 dated Jul. 12, 2013.

Office Action for co-pending U.S. Appl. No. 12/734,044 dated Aug. 26, 2013.

* cited by examiner

In Case of D=VSS

SEMICONDUCTOR DEVICE AND DISPLAY DEVICE

TECHNICAL FIELD

The present invention relates to a semiconductor device constituted by transistors having an identical conductivity type.

BACKGROUND ART

According to a liquid crystal display device, a shift register, which sequentially drives pixels disposed in an array, is employed in a scanning signal line driving circuit and a data signal line driving circuit. Such a liquid crystal display device further includes so-called buffers, each of which outputs an amplified signal in a broad sense with a low output impedance, such as (i) a level shifter which carries out a level conversion with respect to a supply voltage and (ii) an amplifying circuit which outputs an inputted signal as it is. In a case where the shift register and the buffer are constituted by CMOS transistors, both of a process of forming a p-channel and a process of forming an n-channel are necessary. This complicates a manufacturing process of the liquid crystal display device. In view of the circumstances, it is preferable that the manufacturing process is simplified as follows. That is, it is preferable that each of the shift register and the buffer be constituted by transistors having an identical conductivity type, i.e., transistors having a unipolar channel (e.g. merely p-channel). For example, Patent Literature 1 discloses such a shift register constituted by transistors having a unipolar channel.

FIG. 32 is a circuit diagram illustrating a switch constituting the shift register of Patent Literature 1. FIG. 33 is a timing chart showing waveforms of respective various signals in the switch. The switch is constituted by a PMOS transistor QpA and a PMOS transistor QpB. A pulse signal Sin is supplied to a drain terminal of the PMOS transistor QpA, a pulse signal Sout is outputted from a source terminal of the PMOS transistor QpA, and a control signal D is supplied to a gate terminal of the PMOS transistor QpA via the PMOS transistor QpB. A voltage VSS of low level is supplied to a gate of the PMOS transistor QpB.

In a case where the pulse signal Sin has a high level while the control signal D is having a low level, the PMOS transistor QpB turns ON. This pulls down a voltage of the gate (node N) of the PMOS transistor QpA up to (VSS+|Vth|).

Under the circumstances, in a case where a pulse signal Sin of low level is supplied to the drain terminal of the PMOS transistor QpA (see (A) of FIG. 33), electric charge due to a parasitic capacitance between the drain terminal and the gate terminal of the PMOS transistor QpA cause a rapid decline in voltage of the node N. In a case where the voltage of the node N goes below (VSS+|Vth|), the PMOS transistor QpB turns OFF. This causes the node N to be in a floating state. Thus, the electric charge due to the parasitic capacitance is preserved. As a result, in a case where the pulse signal Sin has a voltage VSS, the voltage of the node N becomes smaller than the voltage VSS (see (B) of FIG. 33).

In a case where such a bootstrap operation causes the drain of the PMOS transistor QpA to be reduced to the voltage VSS, the gate terminal is driven by a voltage lower than the voltage VSS due to the electric charge caused by the parasitic capacitance between the gate and the drain. This causes the PMOS transistor QpA to maintain its ON state. As a result, a voltage that is substantially the same as the voltage VSS supplied to the drain terminal is outputted from the source terminal of the PMOS transistor QpA (see (C) of FIG. 33). That is, a voltage of a pulse signal which passes through the PMOS transistor QpA is reduced to the voltage VSS during a pulse period.

According to the circuit configuration of the switch shown in FIG. 32, it is possible to cause a voltage of a pulse signal, which has passed through the switch, to be reduced to the voltage VSS of low level (i) without using a voltage lower than the voltage VSS of low level and (ii) with a simple circuit configuration in which the transistors having an identical conductivity type are employed. As such, such a switch can be suitably used in each section of a liquid crystal display device.

CITATION LIST

Patent Literature 1

Japanese Patent Application Publication, Tokukai, No. 2006-277789 A (Publication Date: Oct. 12, 2006)

SUMMARY OF INVENTION

However, such a conventional switch (see FIG. 32) constituted by transistors having an identical conductivity type causes a problem that an output voltage fluctuates due to an influence of noise. Therefore, in a case where such a switch is used, for example, as a scanning signal line selection circuit of a shift register in a liquid crystal display device, sequential selections of scanning signal lines may not be properly carried out, and therefore malfunction may be caused.

The following description deals with how the fluctuation in output voltage is caused by the influence of noise. Note that, for convenience of description, the following description deals with a case where the conventional switch is constituted by n-channel transistors. FIG. 34 is a circuit diagram obtained in a case where the conventional switch is constituted by n-channel transistors.

First described is a normal operation (operation which is not affected by noise) of the switch shown in FIG. 34. FIG. 35 is a timing chart showing waveforms of respective various signals in the switch, which timing chart is obtained in a case where there is no influence of noise.

In a case where (i) a voltage VDD is supplied to a gate terminal of a transistor T102 and (ii) a control signal D having a high level (VDD) is supplied to a drain terminal of the transistor T102, the transistor T102 turns ON. This causes a node N1 to have an electric potential of (VDD−Vth), where the voltage Vth indicates a threshold voltage of the transistor T102. In a case where the electric potential of the node N1 increases, a transistor T101 turns ON. In a case where an input signal IN has a low level, the transistor T101 outputs a signal having a low level. Meanwhile, in a case where the input signal IN has a high level, the electric potential of the node N1 becomes higher than the VDD due to an influence of a parasitic capacitance of the transistor T101. This causes the transistor T102 to turn OFF, and the electric potential of the node N1 is pulled up due to a bootstrap effect. The input signal IN is outputted, as it is, from an output terminal OUT because the electric potential of the node N1 is pulled up and exceeds (the electric potential (VDD) of the input signal IN+a voltage Vth), where the voltage Vth indicates a threshold voltage of the transistor T101.

As described above, in a case where there is no influence of noise, the switch shown in FIG. 34 can fulfill its function as a switch which controls ON/OFF of the transistors so as to output, as it is, an input signal. However, in a case where such a switch is used in each section of a liquid crystal display device, noise is mixed in the control signal D due to a wiring resistor and the like. FIG. 36 is a timing chart showing waveforms of respective various signals, which timing chart is obtained in a case where noise is mixed in the control signal D.

Under normal conditions, the transistor T102 should turn OFF during the bootstrap operation because the control signal D has the voltage VDD and the transistor T102 has the voltage VDD (see FIG. 35). However, in a case where the control signal D is affected by noise during the bootstrap operation, the electric potential of the control signal D is pulled down toward a low level (see FIG. 36). In a case where a difference in electric potential between the VDD and the control signal D exceeds the threshold voltage Vth of the transistor T102, the transistor T102 which is in an OFF state turns ON. This causes the electric potential of the node N1, which has been pulled up due to the bootstrap effect, to be pulled down toward a low level as with the control signal D.

As described above, according to the conventional switch, in a case where the electric potential of a control signal is reduced due to noise during a bootstrap operation, a transistor which should be in an OFF state under normal conditions turns ON. This causes the electric potential of a node, which has been pulled up, to be pulled down due to the influence of noise. This gives rise to a reduction in output voltage, thereby ultimately causing malfunction in each section of a liquid crystal display device.

The present invention was attained in view of the above problems, and an object of the present invention is to provide (i) a semiconductor device which is constituted by transistors having an identical conductivity type and which is capable of reducing influence of noise, and (ii) a display device including the semiconductor device.

In order to attain the above object, a semiconductor device of the present invention which is constituted by a plurality of transistors having an identical conductivity type, includes: a first transistor which has a first terminal to which an input signal is supplied and a second terminal from which an output signal is outputted; and a second transistor which has a first terminal to which a control signal is supplied and a second terminal which is connected to a control terminal of the first transistor, a control terminal of the second transistor being connected to the first terminal of the second transistor.

A transistor is a circuit which is constituted by a first terminal, a second terminal, and a control terminal, and which outputs an output signal in a case where a control signal supplied to the control terminal causes the first terminal and the second terminal to be electrically connected to each other. The control signal is supplied to the control terminal, and has a voltage (signal level) which causes the transistor to turn ON or a voltage (signal level) which causes the transistor to turn OFF.

According to a conventional circuit, in a case where a control signal is affected by noise during a bootstrap operation, electric potential of the control signal is normally pulled down toward a low level, thereby causing a transistor, which should turn OFF, to turn ON, as described above. This causes electric potential that has been increased due to a bootstrap effect to be pulled down toward a low level, thereby causing an electric potential of an output signal to be lower than an electric potential of an input signal.

In view of this, the semiconductor device of the present invention is arranged such that the control terminal of the second transistor and the first terminal of the second transistor are connected to each other. According to the arrangement, an identical signal is always supplied to the control terminal of the second transistor and the first terminal of the second transistor. As such, even if the control signal is affected by noise during a bootstrap operation so that electric potential of the control signal is pulled down toward a low level, there occurs no difference in electric potential between the control terminal and the first terminal of the second transistor. Therefore, the second transistor will never turn ON, unlike the conventional arrangement. Thus, noise mixed in the control signal causes no reduction in electric potential of a signal supplied to the control terminal of the first transistor. It is therefore possible (i) to carry out an appropriate bootstrap operation, and (ii) to cause an input signal to be outputted as an output signal without causing a reduction in electric potential of the input signal.

According to the arrangement, it is possible to provide a semiconductor device which is constituted by transistors having an identical conductivity type and which is capable of reducing an influence of noise.

The semiconductor device of the present invention is preferably arranged so as to further includes a third transistor which has (i) a first terminal connected to a point at which the control terminal of the first transistor and the second terminal of the second transistor are connected to each other, (ii) a second terminal to which an OFF voltage is supplied, and (iii) a control terminal to which an inversion signal of the control signal is supplied.

In a case where the control signal has a voltage of low level (VSS), the second transistor turns OFF. Here, a signal supplied to the control terminal of the first transistor (a point (node) at which the first transistor and the second transistor are connected to each other) has an electric potential of (VSS+threshold voltage Vth of the second transistor). The electric potential of the node becomes higher than VSS, i.e., becomes closer to the electric potential which causes the first transistor to turn ON. As such, it is more likely that the first transistor turns ON, thereby causing malfunction, in a case where there is a difference in threshold value between the first transistor and the second transistor or in a case where there is a little influence of noise.

In view of this, the semiconductor device of the present invention includes the third transistor. With the arrangement, it is possible to cause the electric potential of the signal supplied to the control terminal of the first transistor to be fixed to VSS while the second transistor is turning OFF. This makes it possible to cause the first transistor to surely turn OFF, thereby preventing malfunction.

The semiconductor device of the present invention is preferably arranged so as to further includes a third transistor which has (i) a first terminal connected to a point at which the control terminal of the first transistor and the second terminal of the second transistor are connected to each other, (ii) a second terminal connected to a point at which the control terminal of the second transistor and the first terminal of the second transistor are connected to each other, and (iii) a control terminal to which an inversion signal of the control signal is supplied.

According to the arrangement, in which the semiconductor includes the third transistor, it is possible to cause the potential of the signal supplied to the control terminal of the first transistor to be fixed to a low level while the second transistor is turning OFF. This makes it possible to cause the first transistor to surely turn OFF, thereby preventing malfunction.

Further, the first terminal of the third transistor is connected to the point at which the control terminal of the first transistor and the second terminal of the second transistor are connected to each other, and the second terminal of the third transistor is connected to the point at which the control terminal of the second transistor and the first terminal of the second transistor are connected to each other. This eliminates the need to use a power supply. Since a circuit can be realized with a simple arrangement, it is also possible to improve flexibility of layout designing.

In order to attain the above object, a semiconductor device of the present invention which is constituted by a plurality of transistors having an identical conductivity type, includes: a first transistor which has a first terminal to which an input signal is supplied and a second terminal from which an output signal is outputted; a second transistor which has a first terminal to which a control signal is supplied and a second terminal which is connected to a control terminal of the first transistor; a fourth transistor which has a first terminal connected to a point at which the control terminal of the first transistor and the second terminal of the second transistor are connected to each other, and a control terminal to which an ON voltage is supplied; and a third transistor which has a first terminal connected to a second terminal of the fourth transistor, and a control terminal to which an inversion signal of the control signal is supplied, a control terminal of the second transistor, the first terminal of the second transistor, and a second terminal of the third transistor being connected to one another.

In order to attain the above object, a semiconductor device of the present invention which is constituted by a plurality of transistors having an identical conductivity type, includes: a first transistor which has a first terminal to which an input signal is supplied and a second terminal from which an output signal is outputted; a second transistor which has a first terminal to which a control signal is supplied and a second terminal which is connected to a control terminal of the first transistor; a fourth transistor which has a first terminal connected to a point at which the control terminal of the first transistor and the second terminal of the second transistor are connected to each other, and a control terminal to which an ON voltage is supplied; and a third transistor which has a first terminal connected to a second terminal of the fourth transistor, a second terminal to which an OFF voltage is supplied, and a control terminal to which an inversion signal of the control signal is supplied, a control terminal of the second transistor and the first terminal of the second transistor being connected to each other.

According to the arrangement, in addition to the above effects, it is possible to produce an effect that a risk of breaking down of the third transistor can be reduced. Specifically, in addition to the above arrangement, the semiconductor device of the present invention includes the fourth transistor. In a case where the control signal has a voltage of high level (VDD) for example, the first transistor and the second transistor turn ON, and potential of a point (node n1) at which the first transistor and the second transistor are connected to each other is increased due to a bootstrap effect. Here, since VDD is supplied to the control terminal of the fourth transistor, the fourth transistor turns ON. This causes an electric potential of a signal (node n2), which is supplied to the first terminal of the third transistor via the transistor T4, to be lower, by a threshold voltage Vth of the fourth transistor, than the potential of the node n1.

This allows a reduction in electric potential between the control terminal and the first terminal of the third transistor, thereby ultimately allowing a reduction in risk of breaking down of the third transistor.

The semiconductor device of the present invention is preferably arranged so as to further include a fifth transistor which has a first terminal to which the control signal is supplied, a control terminal to which an inversion signal of the control signal is supplied, and a second terminal connected to the second terminal of the first transistor.

The semiconductor device of the present invention in preferably arranged so as to further include a fifth transistor which has a first terminal to which an OFF voltage is supplied, a control terminal to which an inversion signal of the control signal is supplied, and a second terminal connected to the second terminal of the first transistor.

According to the arrangement, the above effects can be produced, and since the semiconductor device includes the fifth transistor, the following effect can be also produced. Specifically, in a case where the control signal has a voltage of low level (VSS), the fifth transistor turns ON so that an electric potential of a signal outputted from the first transistor can be fixed to VSS.

In order to attain the above object, a semiconductor device of the present invention which is constituted by a plurality of transistors having an identical conductivity type, includes: a first circuit to which a first input signal is supplied; and a second circuit to which a second input signal is supplied, the semiconductor device outputting, as an output signal, the first input signal or the second input signal in response to a control signal and an inversion signal of the control signal, the control signal and the inversion signal being supplied to each of the first circuit and the second circuit, the first circuit including: a first transistor which has a first terminal to which the first input signal is supplied; and a second transistor which has a first terminal to which the control signal is supplied and a second terminal connected to a control terminal of the first transistor, a control terminal of the second transistor and the first terminal of the second transistor being connected to each other, the second circuit including: an eleventh transistor which has a first terminal to which the second input signal is supplied; and a twelfth transistor which has a first terminal to which the inversion signal is supplied and a second terminal connected to a control terminal of the eleventh transistor, a control terminal of the twelfth transistor and the first terminal of the twelfth transistor being connected to each other, the output signal being outputted from a point at which a second terminal of the first transistor and a second terminal of the eleventh transistor are connected to each other.

According to the arrangement, the first input signal or the second input signal can be outputted as an output signal without a reduction in electric potential.

Therefore, the semiconductor device can be used as a switch for switching a scanning direction in a shift register provided in a display device, for example.

In order to attain the above object, a semiconductor device of the present invention which is constituted by a plurality of transistors having an identical conductivity type, includes: a first transistor which has a first terminal to which an input signal is supplied and a second terminal from which an output signal is outputted; a second transistor which has a first terminal to which the input signal is supplied and a second terminal which is connected to a control terminal of the first transistor; a third transistor which has a first terminal connected to a point at which the control terminal of the first transistor and the second terminal of the second transistor are connected to each other, a second terminal to which the input signal is supplied, and a control terminal to which an inversion signal of the input signal is supplied; and a sixth transistor which has a first terminal connected to the second terminal of the first transistor, a second terminal to which an OFF voltage is supplied, and a control terminal to which an inversion signal of the control signal is supplied, a control terminal of the second transistor and the first terminal of the second transistor being connected to each other.

According to the arrangement, an OFF voltage (VSS) is outputted from the semiconductor device in a case where an input signal has a voltage of low level. In an arrangement in which, for example, the semiconductor device is a buffer, and an internal block which follows the buffer and which includes transistors provided in cascade is provided, it is possible to reduce a through current in each transistor of the internal block. This will be described later in more detail.

A display device of the present invention includes any one of the semiconductor devices.

With the arrangement, it is possible to provide a display device which is capable of reducing an influence of noise.

Note that the display device of the present invention is preferably a liquid crystal display device.

For a fuller understanding of the nature and advantages of the invention, reference should be made to the ensuing detailed description taken in conjunction with the accompanying drawings.

REFERENCE SIGNS LIST

Figure 1:
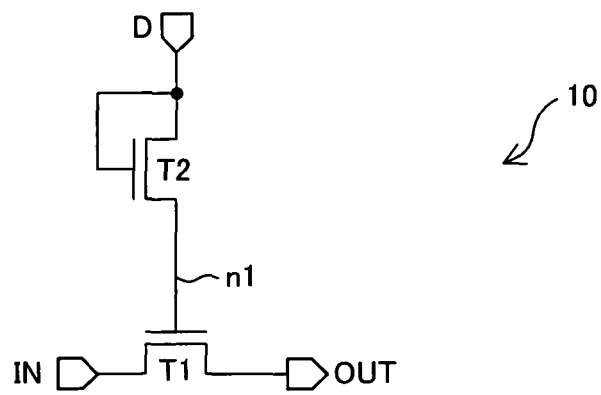
FIG. 1 is a circuit diagram illustrating a circuit configuration of a circuit of the Embodiment 1.

1: Shift register
2: Unit circuit
3: Scanning direction switching circuit
3a: First circuit
3b: Second circuit
4: Reset signal generating circuit
10, 20, 30, 40, 41, 50, 51, 52, 53, 54: Circuit (semiconductor device)
T1: Transistor (first transistor)
T2: Transistor (second transistor)
T3: Transistor (third transistor)
T4: Transistor (fourth transistor)
T5: Transistor (fifth transistor)
T6: Transistor (sixth transistor)
T1': Transistor (eleventh transistor)
T2': Transistor (twelfth transistor)
151: Liquid crystal display device (display device)
n1, n2, n3: Node

DESCRIPTION OF EMBODIMENTS

Embodiments of the present invention are described below with reference to FIGS. 1 through 31.

A circuit which corresponds to a semiconductor device of the present invention is constituted by transistors of an identical conductivity type, i.e., by transistors of a unipolar channel (n-channel transistors or p-channel transistors). Each of the following embodiments exemplifies an arrangement in which the circuit is constituted by re-channel transistors. Note that an arrangement in which the circuit is constituted by p-channel transistors is only exemplified at the end of the Description of Embodiments and is not therefore described in detail. It is possible to use, as such transistors, field-effect transistors on a silicon substrate or TFTs, for example.

Embodiment 1

Figure 2:
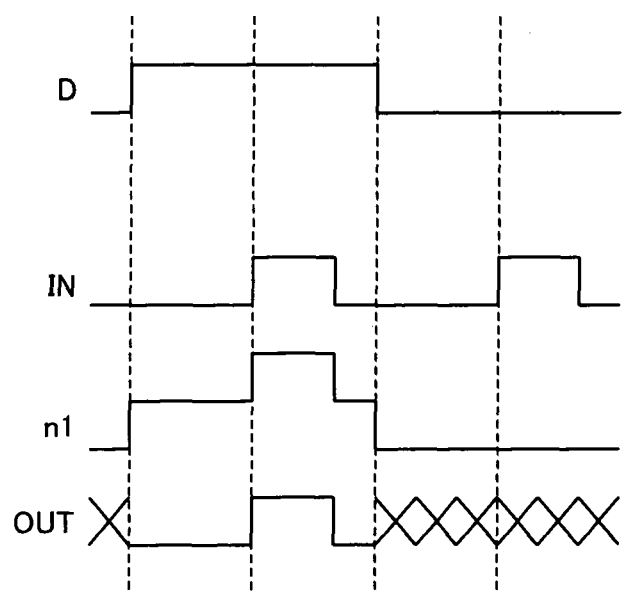
FIG. 2 is a timing chart showing waveforms of respective various signals in the circuit shown in FIG. 1.

A circuit configuration of a circuit 10 of the present embodiment is described below. FIG. 1 is a circuit diagram illustrating the circuit configuration of the circuit 10. FIG. 2 is a timing chart showing waveforms of respective various signals in the circuit 10.

The circuit 10 includes a transistor T1 (first transistor) and a transistor T2 (second transistor). In a case where a voltage (signal level), supplied to a gate terminal (control terminal), causes a transistor to turn ON, such a voltage (signal level) is hereinafter referred to as "ON voltage (ON level)". Similarly, in a case where a voltage (signal level) supplied to a gate terminal (control terminal) causes a transistor to turn OFF, such a voltage (signal level) is hereinafter referred to as "OFF voltage (OFF level)". In an n-channel transistor, a high voltage serves as an ON voltage (i.e., a high level signal serves as an ON level signal), and a low voltage serves as an OFF voltage (i.e., a low level signal serves as an OFF level signal). In contrast, in a p-channel transistor, a low voltage serves as an ON voltage (i.e., a low level signal serves as an ON level signal), and a high voltage serves as an OFF voltage (i.e., a high level signal serves as an OFF level signal).

As illustrated in FIG. 1, the transistor T1 has (i) a drain terminal (first terminal) connected to an input terminal IN, (ii) a source terminal (second terminal) connected to an output terminal OUT, and (iii) a gate terminal (control terminal) connected to a source terminal (second terminal) of the transistor T2. The transistor T2 has a drain terminal (first terminal) connected to an input terminal via which a control signal D is supplied, and a gate terminal (control terminal) connected to the drain terminal of the transistor T2. Note that a point at which the transistor T1 and the transistor T2 are connected to each other is referred to as "node n1".

That is, the circuit 10 of the present embodiment is a so-called diode-connected circuit in which the gate terminal of the transistor T2 and the drain terminal of the transistor T2 are connected to each other. This is unlike the conventional circuit (switch) shown in FIG. 34. With the circuit configuration, it is possible that the circuit 10 outputs an output signal which is less affected by a noise which the conventional circuit has had. The following description deals with an operation of the circuit 10 with reference to FIG. 2. Note that in a case where a signal in the circuit 10, a signal supplied to the circuit 10, and a signal outputted from the circuit 10 have a voltage of high level, such signals have an electric potential of VDD, whereas in a case where a signal in the circuit 10, a signal supplied to the circuit 10, and a signal outputted from the circuit 10 have a voltage of low level, such signals have an electric potential of VSS (zero), unless otherwise specified.

In a case where the control signal D has a voltage of high level (VDD), VDD is supplied to the gate terminal of the transistor T2, so that the transistor T2 turns ON. This causes the drain terminal and the source terminal of the transistor T2 to be electrically connected to each other, so that an electric potential of the node n1 increases. Here, a threshold voltage of the transistor T2 is indicated by Vth. In a case where the electric potential of the node n1 increases to (VDD−Vth), the transistor T2 turns OFF. This causes the node n1 to be in a floating state.

In a case where the electric potential of (VDD−Vth) is supplied to the gate terminal of the transistor T1, the transistor T1 turns ON. Here, in a case where VSS is supplied to the input terminal IN, a signal of low level is outputted. The node n1, which is in a floating state, holds the electric potential of (VDD−Vth). This is because a parasitic capacitance between the gate and the drain of the transistor T1 is charged in accordance with the electric potential (VDD−Vth).

In a case where VDD is supplied to the input terminal IN while the node n1 is holding the electric potential of (VDD−Vth), an output signal OUT has a voltage of high level (VDD). Since the node n1 is in the floating state, the node and the drain terminal of the transistor T1 are connected via the parasitic capacitance which causes the electric potential (VDD−Vth) to be held. Therefore, in a case where an electric potential of the source terminal of the transistor T1 is changed from VSS to VDD, the electric potential of the node n1 is changed as much electric potentials. This pulls up the electric potential of the node n1 up to an electric potential of not less than (VDD+threshold voltage Vth of the transistor T1) (bootstrap effect). As a result, the input signal whose maximum voltage is VDD passes through the transistor T1 without a voltage attenuation, and is then outputted, as it is, from the output terminal OUT.

Figure 36:
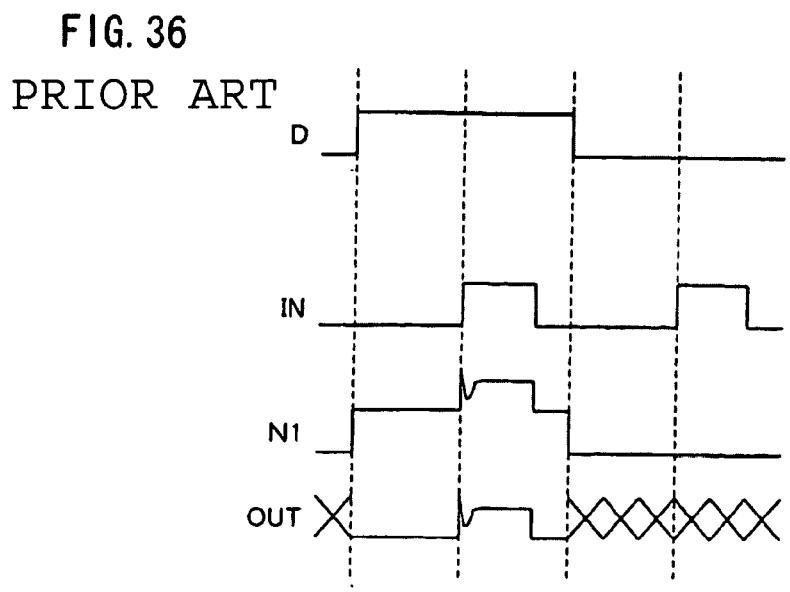
FIG. 36 is a timing chart showing waveforms of respective various signals in the switch, which timing chart is obtained in a case where an influence of noise exists.

According to the conventional circuit, in a case where the control signal D is affected by noise during the bootstrap operation, the electric potential of the control signal D is pulled down toward a low level (see FIG. 36). In a case where a difference in electric potential between VDD and the control signal D exceeds the threshold value Vth of the transistor T2, the transistor T2 which is in an OFF state turns ON. This causes the electric potential of the node n1, which has been pulled up due to the bootstrap effect, to be pulled down toward a low level, as with the control signal D. As a result, an electric potential of an output signal becomes smaller than that of the input signal.

In contrast, according to the circuit 10 of the present embodiment, the gate terminal of the transistor T2 and the drain terminal of the transistor T2 are connected to each other (see FIG. 1). This causes an identical signal to be always supplied to the gate terminal and the drain terminal of the transistor T2. That is, there occurs no difference in electric potential between the gate terminal and the drain terminal of the transistor T2 even if the electric potential of the control signal D is pulled down toward a low level during the bootstrap operation due to an influence of noise. Therefore, the transistor T2 will never turn ON, unlike the conventional circuit. Thus, the noise mixed in the control signal D does not affect the node n1. It is therefore possible (i) to carry out an appropriate bootstrap operation and (ii) to cause the input signal to be outputted from the output terminal OUT while it maintains the electric potential level VDD.

Embodiment 2

Figure 3:
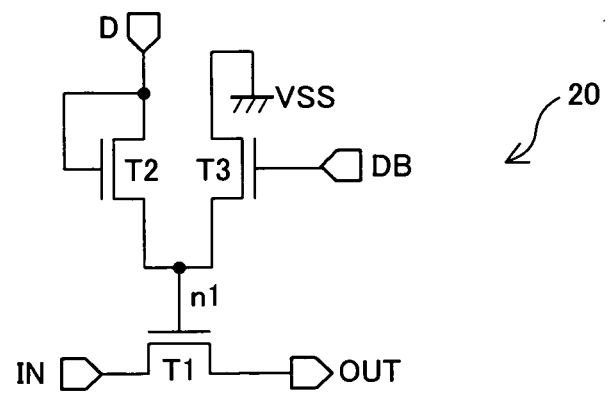
FIG. 3 is a circuit diagram illustrating a circuit configuration of a circuit of the Embodiment 2.
Figure 4:
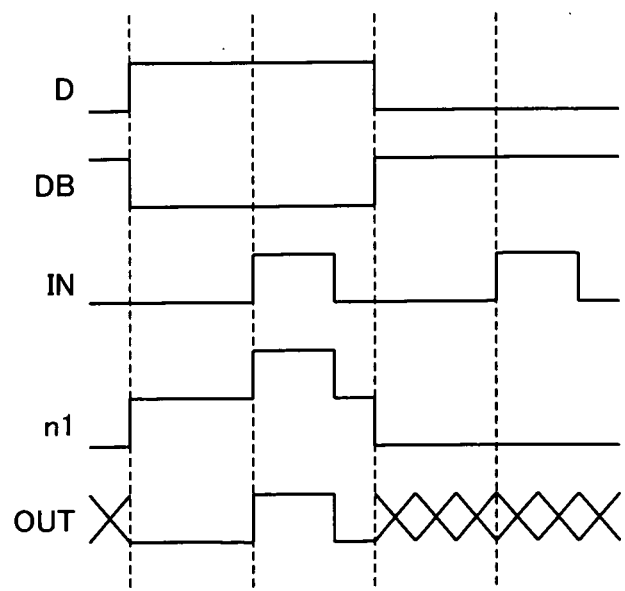
FIG. 4 is a timing chart showing waveforms of respective various signals in the circuit shown in FIG. 3.

The following description discusses a circuit configuration of a circuit 20 of the present embodiment. FIG. 3 is a circuit diagram illustrating the circuit configuration of the circuit 20, and FIG. 4 is a timing chart showing waveforms of respective various signals in the circuit 20. Note, for convenience of description, that constituents which have functions identical to those of the Embodiment are given identical reference numerals, and are not explained repeatedly. Note also that the terms defined in the Embodiment 1 are used in the present embodiment, unless otherwise specified.

According to the circuit configuration of the circuit 10 of the Embodiment 1 (see FIG. 1), in a case where the control signal D has a voltage of low level (VSS), the transistor T2 turns OFF. Here, the node n1 has an electric potential of (VSS+the threshold voltage Vth of the transistor T2). The electric potential of the node n1 becomes higher than VSS, i.e., becomes closer to the electric potential which causes the transistor T1 to turn ON. As such, it is more likely that the transistor T1 turns ON, (i) in a case where the transistor T1 and the transistor T2 are different in threshold value or (ii) in a case where there is a little influence of noise, for example.

In view of the circumstances, the circuit 20 of the present embodiment includes a transistor T3 (third transistor) and a low power supply VSS in addition to the circuit configuration of the circuit 10 shown in FIG. 1. With the arrangement, the electric potential of the node n1 can be fixed to VSS so that the transistor T1 surely turns OFF while the transistor T2 is turning OFF.

Specifically, as illustrated in FIG. 3, the transistor T1 has a drain terminal connected to an input terminal IN, a source terminal connected to an output terminal OUT, and a gate terminal connected to a source terminal of the transistor T2 and a drain terminal (first terminal) of the transistor T3. The transistor T2 has a drain terminal connected to an input terminal via which a control signal D is supplied, and a gate terminal connected to the drain terminal of the transistor T2. The transistor T3 has a source terminal (second terminal) connected to the power supply VSS, and a gate terminal (control terminal) connected to an input terminal via which an inversion signal DB of the control signal D is supplied. Note that a point at which the transistor T1, the transistor T2, and the transistor T3 are connected to one another is referred to as "node n1".

The following description deals with an operation of the circuit 20 with reference to FIG. 4. In a case where the control signal D has a voltage of high level (VDD), the circuit 20 operates in a similar manner to the circuit 10. Specifically, even if the control signal D is affected by noise, the input signal having potential of VDD passes through the transistor T1 without a voltage attenuation, and is then outputted, as it is, from the output terminal OUT.

Meanwhile, in a case where the control signal D has a voltage of low level (VSS), the transistor T3 turns ON since the inversion signal DB (high level: VDD) of the control signal D is supplied to the gate terminal of the transistor T3. This causes the drain terminal and the source terminal of the transistor T3 to be electrically connected to each other, and therefore the electric potential of the node n1 is reduced to VSS. Since the VSS is supplied to the gate terminal of the transistor T1, the transistor T1 surely turns OFF.

As described above, according to the circuit configuration of the circuit 20, the electric potential of the node n1 can be fixed to VSS while the transistor T2 is turning OFF. This allows the transistor T1 to surely turn OFF while the transistor T2 is turning OFF. As a result, it is possible to prevent malfunction.

Embodiment 3

Figure 5:
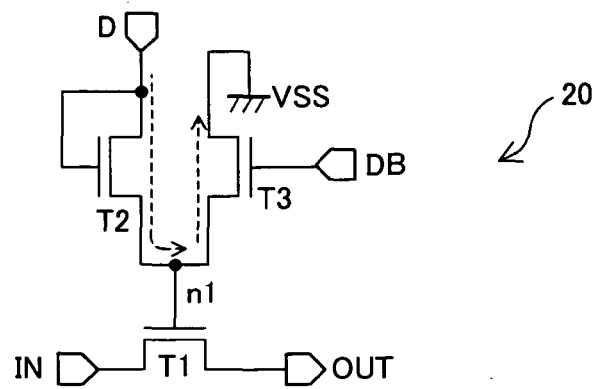
FIG. 5 is a circuit diagram showing how a through current flows in the circuit shown in FIG. 3.
Figure 6:
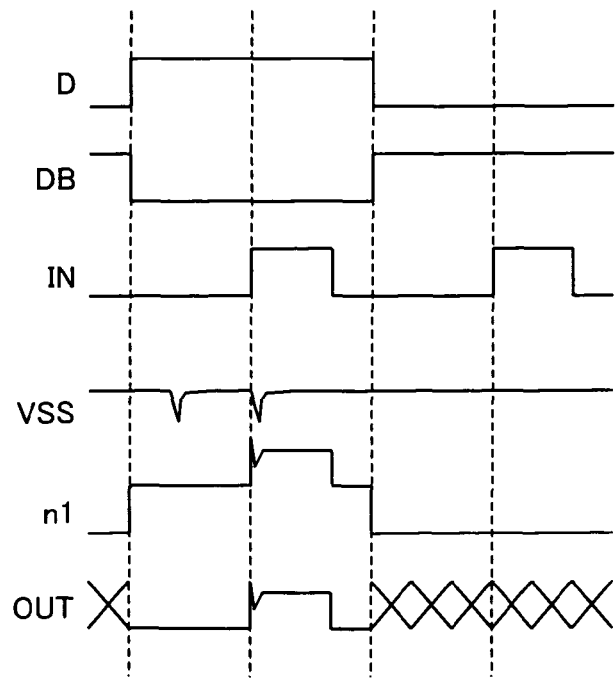
FIG. 6 is a timing chart showing waveforms of respective various signals, which timing chart is obtained in a case where a through current occurs in the circuit shown in FIG. 3.
Figure 7:
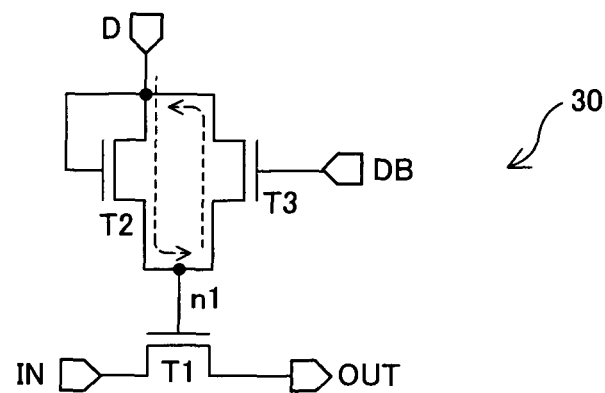
FIG. 7 is a circuit diagram illustrating a circuit configuration of a circuit of the Embodiment 3.

The following description discusses a circuit configuration of a circuit 30 of the present embodiment. FIG. 5 is a circuit diagram illustrating how a through current flows in the circuit 20 of the Embodiment 2. FIG. 6 is a timing chart showing waveforms of respective various signals in the circuit 20. FIG. 7 is a circuit diagram illustrating a circuit configuration of the circuit 30 of the present embodiment. Note, for convenience of description, that constituents which have functions identical to those of the Embodiments 1 and 2 are given identical reference numerals, and are not explained repeatedly. Note also that the terms defined in the Embodiment 1 and 2 are used in the present embodiment, unless otherwise specified.

According to the circuit configuration of the circuit 20 of the Embodiment 2 (see FIG. 3), the power supply VSS is provided. This may cause noise to be mixed in VSS, which is supplied to the source terminal of the transistor T3, due to wiring resistor of a power supply wire and the like. In a case where noise is mixed in VSS while (i) the control signal D is having a voltage of high level (VDD) and (ii) the transistor T2 is turning ON, the electric potential of the VSS is pulled down. In a case where the electric potential of the VSS is less than an electric potential of the inversion signal DB of the control signal, the transistor T3, which should turn OFF, turns ON. This causes both of the transistor T2 and the transistor T3 to turn ON, so that a through current, as shown in FIG. 5. This causes an increase in power consumption. Further, in a case where the VSS is affected by noise during the bootstrap operation, the electric potential of the node n1 is reduced in response to the VSS. As a result, an electric potential level of an output signal becomes lower than that of the input signal.

In view of the circumstances, the circuit 30 of the present embodiment is configured as follows (see FIG. 7) so that an influence of noise can be reduced. Specifically, the circuit 30 is configured such that (i) the low power supply VSS is removed from the circuit 20 of the Embodiment 2, and (ii) a source terminal of a transistor T3, a drain terminal of a transistor T2, and a gate terminal of the transistor T2 are connected to one another. That is, the source terminal of the transistor T3 is connected to an input terminal of a control signal D.

The following description deals with an operation of the circuit 30. Note that waveforms of respective various signals in the circuit 30 are identical to those shown in the timing chart of FIG. 4 which shows a state where no through current occurs. Specifically, in a case where the control signal D has a voltage of high level (VDD), an inversion signal DB (low level: VSS) of the control signal D is supplied to the gate terminal of the transistor T3. This causes the transistor T3 to keep turning OFF, thereby preventing occurrence of a through current. As a result, an input signal having potential of VDD passes through the transistor T1 without a voltage attenuation, and then is outputted from an output terminal OUT while keeping its voltage level.

Further, in a case where the control signal D has a voltage of low level (VSS), the transistor T2 turns OFF, and an inversion signal DB (voltage of high level: VDD) of the control signal D is supplied to the gate terminal of the transistor T3. Thus, the transistor T3 turns ON. This causes the drain terminal and the source terminal of the transistor T3 to be electrically connected to each other, thereby causing the electric potential of the node n1 to be reduced to the VSS. Since the VSS is supplied to gate terminal of the transistor T1, the transistor T1 turns OFF.

With the circuit configuration of the circuit 30, no power supply VSS is thus necessary. As such, it is possible (i) to eliminate an influence of noise and (ii) to prevent the transistor T3 from turning ON during a period in which the transistor T3 should turn OFF. This makes it possible (i) to prevent occurrence of a through current and (ii) to output an output signal so that the output signal has an electric potential identical to that of the input signal.

According to the present embodiment, no power supply VSS is necessary. This allows a circuit configuration to be simplified. This can bring about a further effect of capable of improving flexibility of layout designing.

Embodiment 4

The following description discusses a circuit configuration of a circuit 40 of the present embodiment. Note, for convenience of description, that constituents which have functions identical to those of the Embodiments 1 through 3 are given identical reference numerals, and are not explained repeatedly. Note also that the terms defined in the Embodiment 1 through 3 are used in the present embodiment, unless otherwise specified.

According to a circuit configuration shown in Embodiments 2 and 3, in a case where the control signal D has a voltage of high level (VDD), a bootstrap effect causes an increase in a difference between the electric potential of the node n1 and the electric potential (VSS) of the inversion signal DB supplied to the gate terminal of the transistor T3. If such a difference exceeds a withstand voltage between the gate and the drain of the transistor T3, then there occurs a problem that the transistor T3 breaks down.

Figure 8:
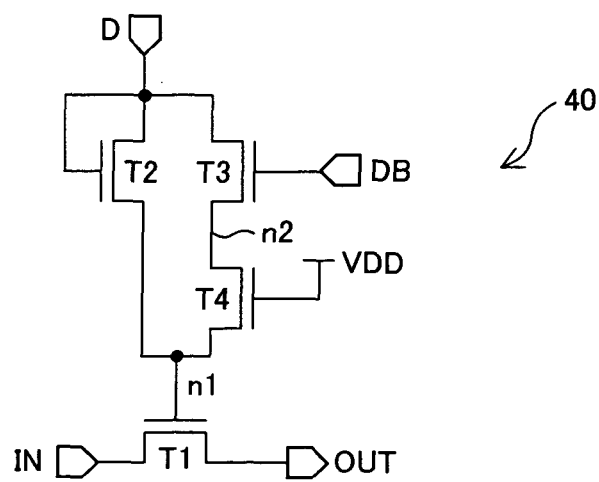
FIG. 8 is a circuit diagram illustrating a circuit configuration of a circuit of the Embodiment 4.
Figure 9:
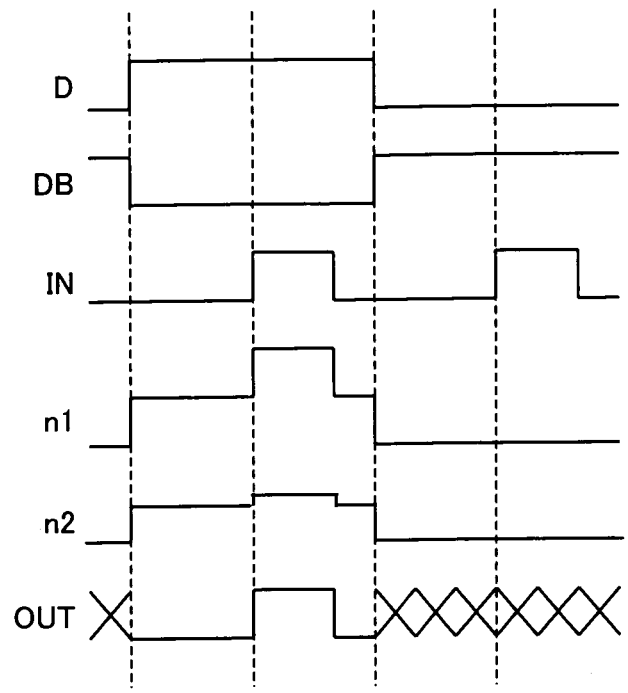
FIG. 9 is a timing chart showing waveforms of respective various signals in the circuit shown in FIG. 7.

In view of the circumstances, according to the circuit of the present embodiment, a transistor T4 (fourth transistor) is further provided between the node n1 and the transistor T3 of the circuit 30 (see FIG. 7). FIG. 8 is a circuit diagram illustrating a circuit configuration of the circuit 40. FIG. 9 is a timing chart showing waveforms of respective various signals in the circuit 40.

As illustrated in FIG. 8, according to the circuit 40, the transistor T4 has a drain terminal (first terminal) connected to a source terminal of a transistor T2 and a gate terminal of a transistor T1, and a source terminal (second terminal) connected to a drain terminal of the transistor T3, and a gate terminal to which VDD is supplied from a high power supply. Note that a node n1 indicates a point at which the transistor T1, the transistor T2, and the transistor T4 are connected to one another, and a node n2 indicates a point at which the transistor T3 and the transistor T4 are connected to each other.

The following description deals with an operation of the circuit 40 with reference to FIG. 9. In a case where the control signal D has a voltage of high level (VDD), the transistor T1 and the transistor T2 turn ON. An electric potential of the node n1 is increased due to a bootstrap effect, as with the operation of the circuit 10. Since VDD is supplied to the gate terminal of the transistor T4, the transistor T4 turns ON. This causes an electric potential of a signal (electric potential of the node n2), which is supplied to the drain terminal of the transistor T3 via the transistor T4, to be lower, by a threshold voltage Vth of the transistor T4, than the electric potential of the node n1.

This allows a reduction in electric potential between the gate and the drain of the transistor T3, thereby ultimately allowing a reduction in risk of breaking down of the transistor T3.

Figure 10:
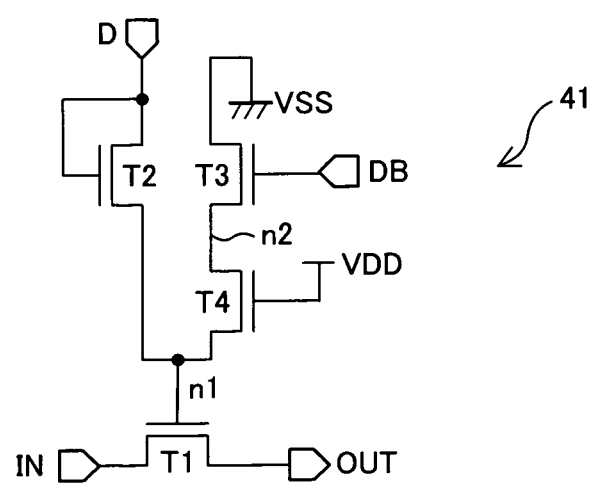
FIG. 10 is a circuit diagram illustrating a circuit configuration of a circuit obtained by adding a transistor T4 to the circuit shown in FIG. 3.

Note that such a circuit configuration, in which the transistor T4 is further provided, can also be applied to the arrangements of the other embodiments. For example, FIG. 10 illustrates a circuit configuration of a circuit 41 which is obtained by further providing a transistor T4 in the circuit 20 shown in FIG. 3. According to the circuit configuration, it is possible to reduce potential between the gate and the drain of the transistor T3, similarly to the way the potential of the node n2 of the circuit 40 shown in FIG. 9 is reduced.

Embodiment 5

The following description discusses a circuit configuration of a circuit 50 of the present embodiment is described below. Note, for convenience of description, that constituents which have functions identical to those of the Embodiments 1 through 4 are given identical reference numerals, and are not explained repeatedly. Note also that the terms defined in the Embodiment 1 through 4 are used in the present embodiment, unless otherwise specified.

According to the arrangements of the circuits of the Embodiments 1 through 4, the transistor T1 turns OFF, in a case where the control signal D has a voltage of low level (VSS). Therefore, no signal is outputted from the output terminal OUT. That is, the output terminal OUT is in an uncertain state (see FIGS. 2, 4, 6, and 9).

Figure 11:
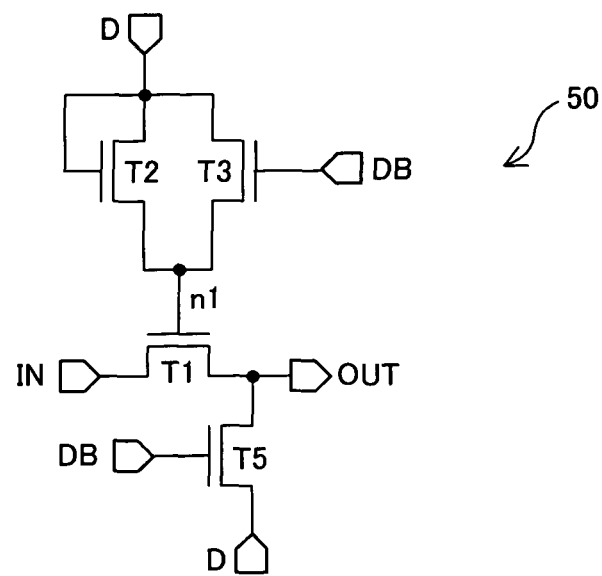
FIG. 11 is a circuit diagram illustrating a circuit configuration of a circuit of the Embodiment 5.
Figure 12:
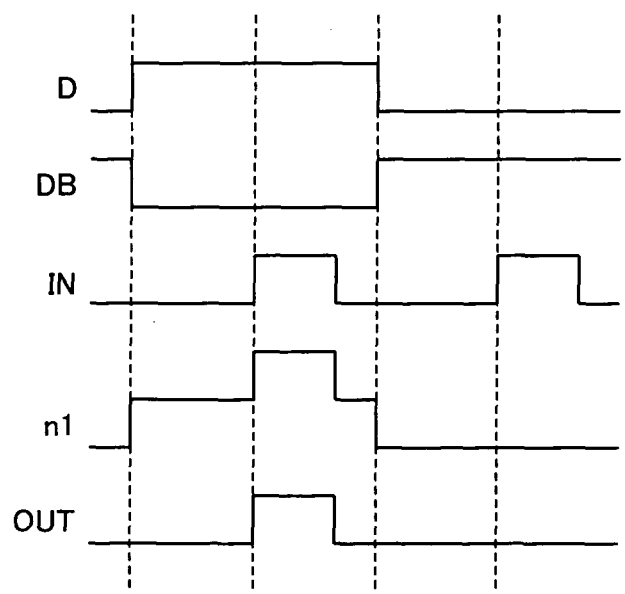
FIG. 12 is a timing chart showing waveforms of respective various signals in the circuit shown in FIG. 11.

In view of the circumstances, according to the circuit 50 of the present embodiment, a voltage VSS is outputted during the uncertain state (uncertain period). FIG. 11 is a circuit diagram illustrating a circuit configuration of the circuit 50 from which the voltage VSS is outputted in a case where a control signal D has a voltage of low level (VSS). FIG. 12 is a timing chart showing waveforms of respective various signals in the circuit 50.

As illustrated in FIG. 11, according to the circuit 50, a transistor T5 (fifth transistor) is further provided in the circuit 30 shown in FIG. 7. The transistor T5 has a source terminal (second terminal) connected to a source terminal of a transistor T1, a drain terminal (first terminal) to which a control signal D is supplied, and a gate terminal (control terminal) to which an inversion signal DB of the control signal is supplied. According to the arrangement, in a case where the control signal D has a voltage of low level (VSS), the transistor T5 turns ON. Therefore, the VSS is outputted from an output terminal OUT. This allows an electric potential of an output signal to be fixed to the VSS during the uncertain period, as shown in FIG. 12.

Figure 13:
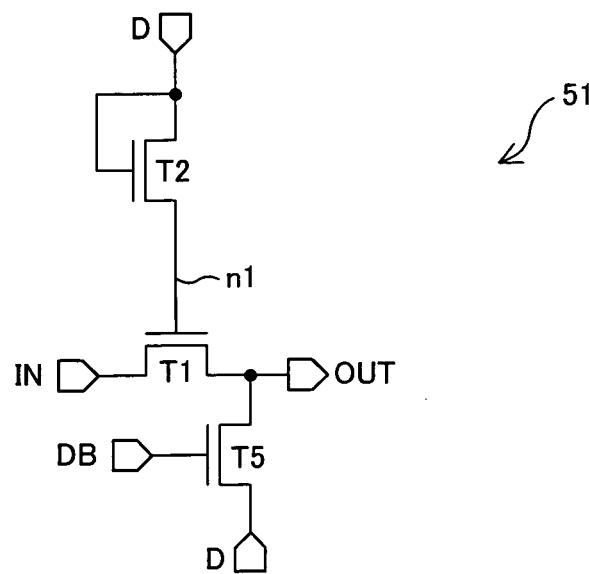
FIG. 13 is a circuit diagram illustrating a circuit configuration of a circuit obtained by adding a transistor T5 to the circuit shown in FIG. 1.
Figure 14:
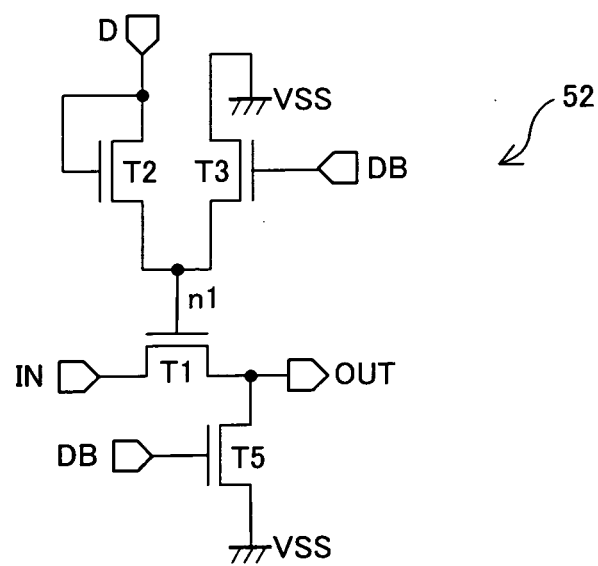
FIG. 14 is a circuit diagram illustrating a circuit configuration of a circuit obtained by adding a transistor T5 to the circuit shown in FIG. 3.
Figure 15:
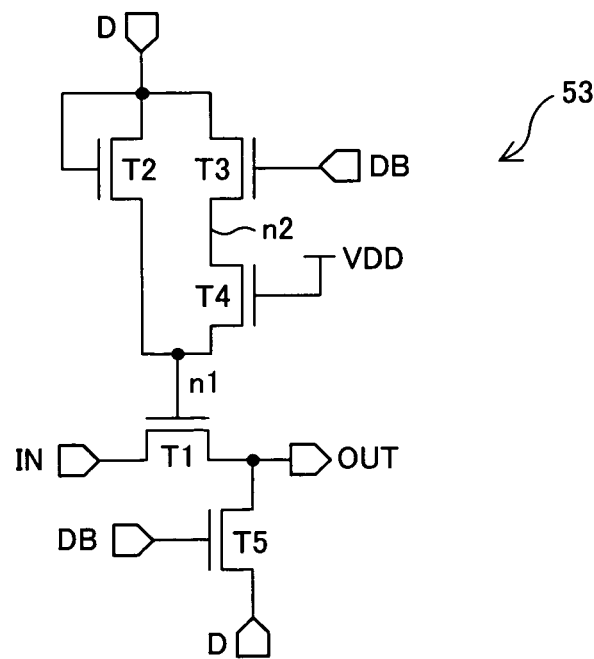
FIG. 15 is a circuit diagram illustrating a circuit configuration of a circuit obtained by adding a transistor T5 to the circuit shown in FIG. 8.
Figure 16:
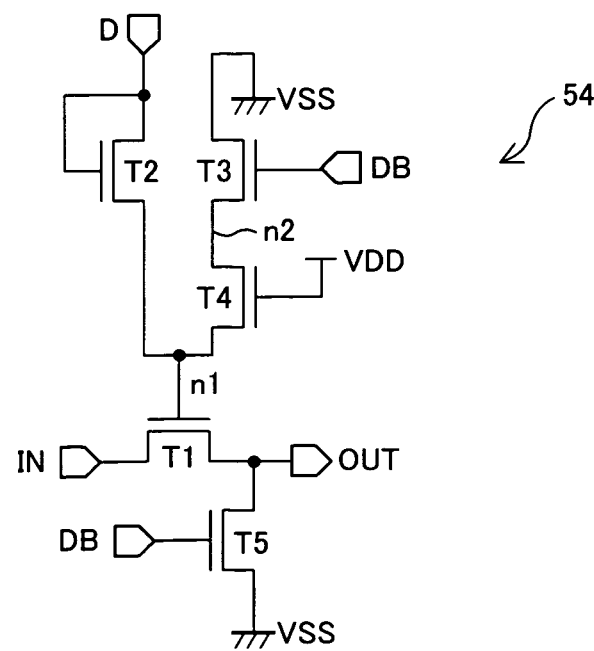
FIG. 16 is a circuit diagram illustrating a circuit configuration of a circuit obtained by adding a transistor T5 to the other circuit of the Embodiment 4.

The present embodiment has dealt with a circuit configuration in which the transistor T5 is further provided in the circuit 30 of the Embodiment 3. However, it is possible to apply such a circuit configuration in which the transistor T5 is further provided to the circuits 10, 20 and 40 which are described in the Embodiments 1, 2 and 4, respectively. FIG. 13 is a circuit diagram illustrating a circuit configuration in which the transistor T5 is further provided in the circuit 10 of the Embodiment 1. FIG. 14 is a circuit diagram illustrating a circuit configuration in which the transistor T5 is further provided in the circuit 20 of the Embodiment 2, FIG. 15 is a circuit diagram illustrating a circuit configuration in which the transistor T5 is further provided in the circuit 40 of the Embodiment 4, and FIG. 16 is a circuit diagram illustrating a circuit configuration in which the transistor T5 is further provided in the circuit 41 of the Embodiment 4. The circuits illustrated in FIGS. 13 through 16 are given respective reference numerals 51, 52, 53 and 54.

The circuits 52 and 54 respectively illustrated in FIGS. 14 and 16, in each of which the VSS is supplied to the transistor T3, can be configured such that the VSS is also supplied to the transistor T5 that is further provided.

This allows an output signal in each of the circuits 51, 52, 53, and 54 to have potential of VSS during the uncertain period, as with the output signal OUT (see FIG. 12) of the circuit 50 shown in FIG. 11.

Figure 17:
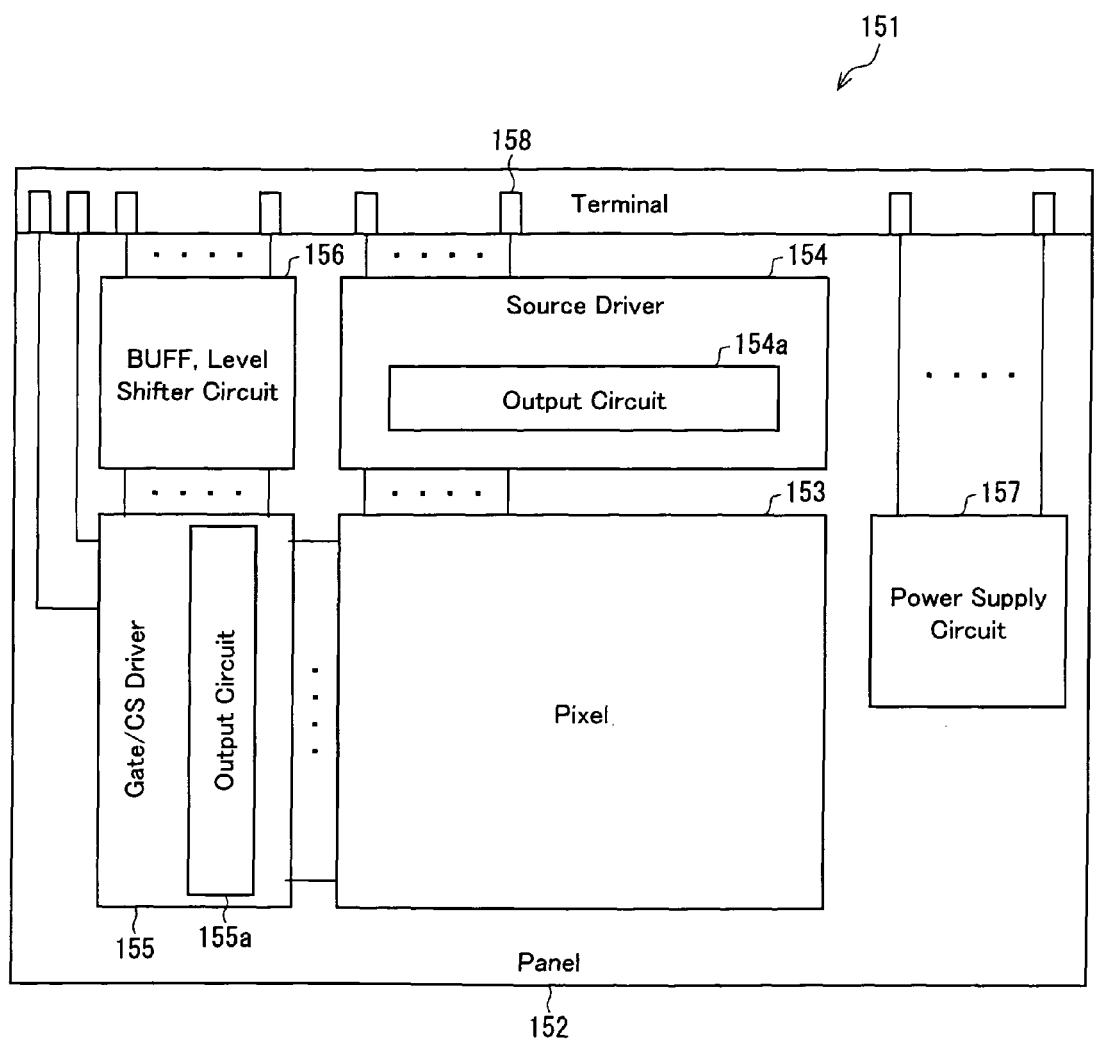
FIG. 17 is a block diagram illustrating an overall arrangement of a liquid crystal display device of the present embodiment.

Each of the circuits described in the respective Embodiments 1 through 5 can be suitably applied especially to a liquid crystal display device (display device). FIG. 17 is a block diagram illustrating an overall arrangement of a liquid crystal display device.

A liquid crystal display device 151 includes, on its panel 152, a pixel region 153, a source driver 154, a gate/CS driver 155, a BUFF/level shifter circuit 156, a power supply circuit 157, and terminals 158. The source driver 154 includes an output circuit 154a, and causes the output circuit 154a to output a data signal to each source bus line of the pixel region 153. The gate/CS driver 155 includes an output circuit 155a, and causes the output circuit 155a (i) to output a selection signal to each gate bus line so as to write the data signals supplied from the source driver 154 into corresponding pixels of the pixel region 153 and (ii) to output a CS signal to each CS bus line so as to increase an electric potential to be written into the corresponding pixels of the pixel region 153. Each of the output circuits 154a and the 155a is constituted by a buffer which is an amplifying circuit which outputs, as a data signal, an inputted signal, as it is, with a low output impedance. The BUFF/level shifter circuit includes buffers, which are amplifying circuits that carry out amplification with a low impedance, such as an amplifying circuit which outputs an inputted signal as it is and which compensates attenuation of a signal of an inverter or the like and a level shifter circuit which carries out a level conversion with respect to supply voltage of a signal. The BUFF/level shifter circuit supplies a signal to the source driver 154 and the gate driver 155 via these buffers. The power supply circuit 157 generates a reference voltage of the data signal, an opposing voltage, and a storage capacitor voltage. The terminals 158 supply signals and power to the circuits provided on the panel 152.

Each of the circuits described in the Embodiments 1 through 5 can be applied to each section in the liquid crystal display device 151, can be suitably used especially in a switch in the CS driver, a buffer, a level shifter circuit, and a shifter register in a source driver (data signal line driving circuit) and a gate driver (scanning signal line driving circuit). The following description deals with (i) an example in which a circuit of any one of the embodiments is applied to a shift register in a gate driver (Example 1) and (ii) an example in which a circuit of any one of the embodiments is applied to a buffer (Example 2).

EXAMPLE 1

Figure 18:
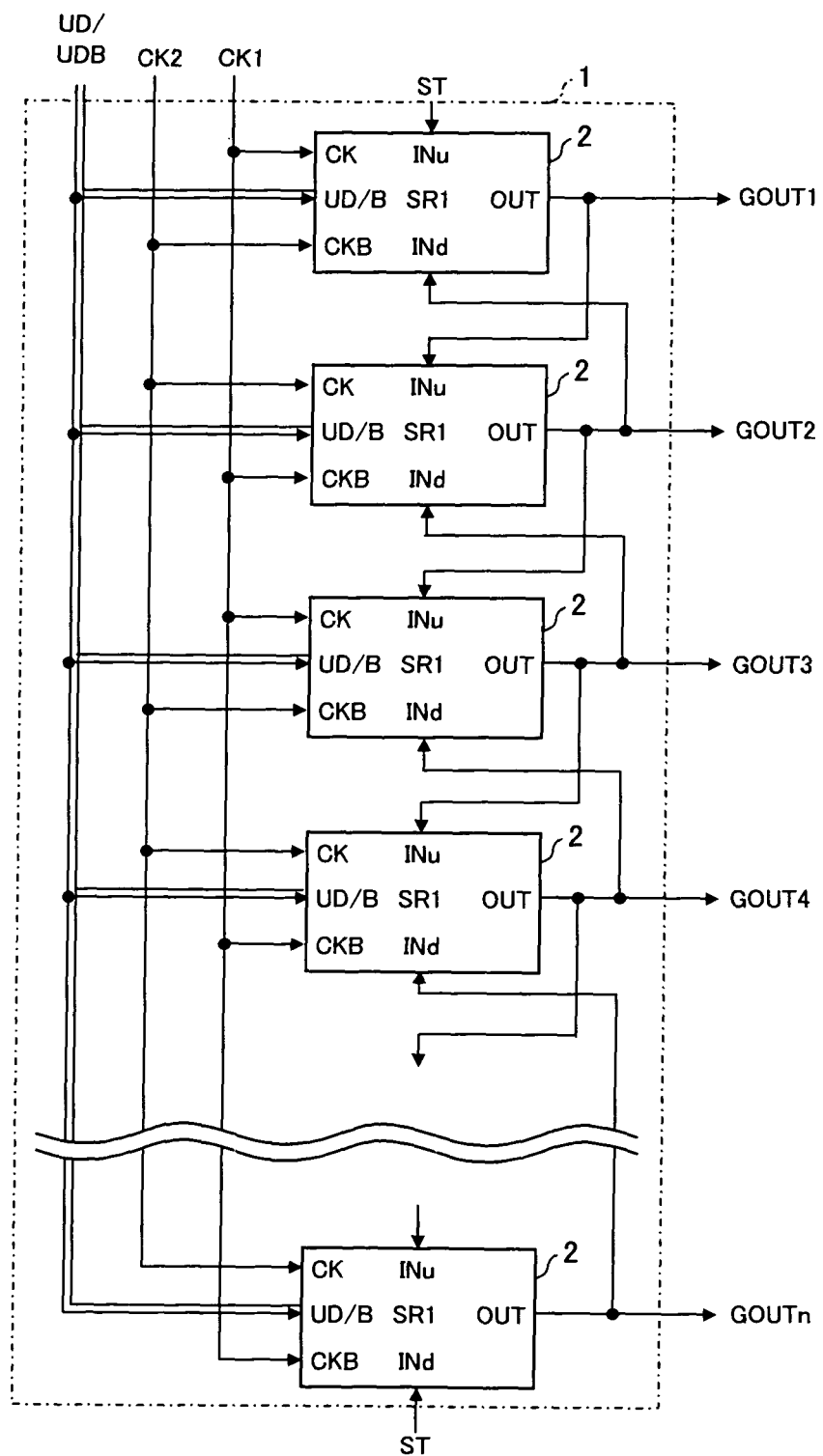
FIG. 18 is a block diagram illustrating an arrangement of a shift register of the Example 1.

FIG. 18 is a block diagram illustrating a circuit configuration of a shift register 1 of the present Example. The shift register 1 illustrated in FIG. 18 includes first through n-th (n is an integer equal to or larger than 2) unit circuits 2 connected in cascade, and has a function to switch a scanning direction (a direction in which an output signal is shifted). Each of the unit circuits 2 includes clock terminals CK and CKB, scanning direction switching terminals UD and UDB, input terminals INu and INd, and an output terminal OUT.

A start pulse ST and two-phase clock signals CK1 and CK2 are externally supplied to the shift register 1. The start pulse ST is supplied to an input terminal INu of the first unit circuit 2 and to an input terminal INd of the n-th unit circuit 2. The clock signal CK1 is supplied to clock terminals CK of odd-numbered ones of the first through n-th unit circuits 2 and to clock terminals CKB of even-numbered ones of the first through n-th unit circuits 2, and the clock signal CK2 is supplied to clock terminals CKB of the odd-numbered ones of the first through n-th unit circuits 2 and to clock terminals CK of the even-numbered ones of the first through n-th unit circuits 2. Output signals OUT of the respective first through n-th unit circuits 2 are outputted to an outside as respective output signals GOUT1 through GOUTn. An output terminal of one of any adjacent ones of the first through n-th unit circuits 2 is connected to an input terminal INu of the other which follows the one. An output terminal of the other is connected to an input terminal Ind of the one which is followed by the other. In each of the first through n-th unit circuits 2, scanning direction switching signals UD and UDB (inversion signal of UD) are externally supplied to scanning direction switching terminals UD and UDB, respectively.

Figure 19:
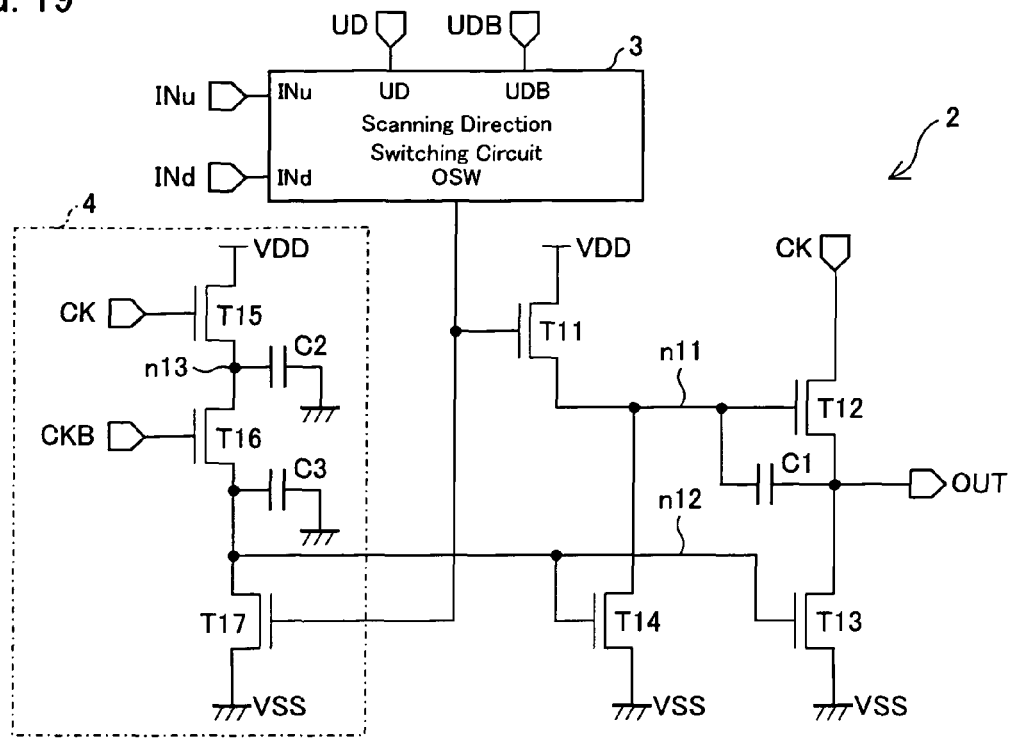
FIG. 19 is a circuit diagram illustrating a unit circuit included in the shift register shown in FIG. 18.

FIG. 19 is a circuit diagram illustrating a unit circuit 2 included in the shift register 1. As illustrated in FIG. 19, the unit circuit 2 is constituted by transistors having an identical conductivity type, and includes seven transistors T11 through T17, three capacitors C1 through C3, and a scanning direction switching circuit 3. The scanning direction switching circuit 3 is constituted by the circuit described in any one of the embodiments.

A power supply voltage VDD is supplied to a drain terminal of the transistor T11, and an output signal of the scanning direction switching circuit 3 is supplied, as an input signal, to a gate terminal of the transistor T11. A source terminal of the transistor T11 is connected to a gate terminal of the transistor T12 and a drain terminal of the transistor T14. A point at which the transistor T11, the transistor T12, and the transistor T14 are connected to one another is hereinafter referred to as "node n11". A drain terminal of the transistor T12 is connected to a clock terminal CK, and a source terminal of the transistor T12 is connected to an output terminal OUT and a drain terminal of the transistor T13. A source terminal of the transistor T13 and a source terminal of the transistor T14 are grounded.

A power supply voltage VDD is supplied to a drain terminal of the transistor T15, and a source terminal of the transistor T15 is connected to a drain terminal of the transistor T16. A source terminal of the transistor T16 is connected to a drain terminal of the transistor T17, and a source terminal of the transistor T17 is grounded. A gate terminal of the transistor T15 is connected to a clock terminal CK, a gate terminal of the transistor T16 is connected to a clock terminal CKB, and a gate terminal of the transistor T17 is connected to an output terminal of the scanning direction switching circuit 3. A point at which the transistor T16 and the transistor T17 are connected to each other is connected to a gate terminal of the transistor T13 and a gate terminal of the transistor T14. A point at which the transistor T16, the transistor T17, the transistor T13, and the transistor T14 are connected to one another is hereinafter referred to as "node n12", and a point at which the transistor T15 and the transistor T16 are connected to each other is hereinafter referred to as "node n13".

Each of the capacitances C1 through C3 is constituted by a capacitive element. The capacitor C1 is provided between the gate terminal and the source terminal of the transistor T12, the capacitor C2 is provided between the node n13 and the ground, and the capacitor C3 is provided between the node n12 and the ground. The capacitor C1 functions as a bootstrap capacitor, and each of the capacitors C2 and C3 functions as a charge pump capacitor.

In the unit circuit 2, the transistors T15 through T17 and the capacitances C2 and C3 constitute a reset signal generating circuit 4, and the transistors T11 through T14 function as a pre-charge circuit, an output control transistor, an output reset circuit, and a discharge circuit, respectively. Based on an electric potential of the gate terminal, the transistor T12 switches between (i) a state where a clock signal CK is outputted from the output terminal OUT and (ii) a state where no clock signal CK is outputted from the output terminal OUT. The transistor T11 supplies a voltage of high level to the node n11 (the gate terminal of the transistor T12) while an input signal (an output signal of the scanning direction switching circuit 3) is having a voltage of high level. The reset signal generating circuit 4 generates a reset signal which normally has a voltage of high level and which changes to have a voltage of low level when an input signal, supplied to the gate terminal of the transistor T17 (an output signal of the scanning direction switching circuit 3), is changed to have a voltage of high level. The transistor T14 supplies a voltage of low level (VSS) to the node n11 while the reset signal is having a voltage of high level. The transistor T13 supplies a voltage of low level (VSS) to the output terminal OUT while the reset signal is having a voltage of high level.

Figure 20:
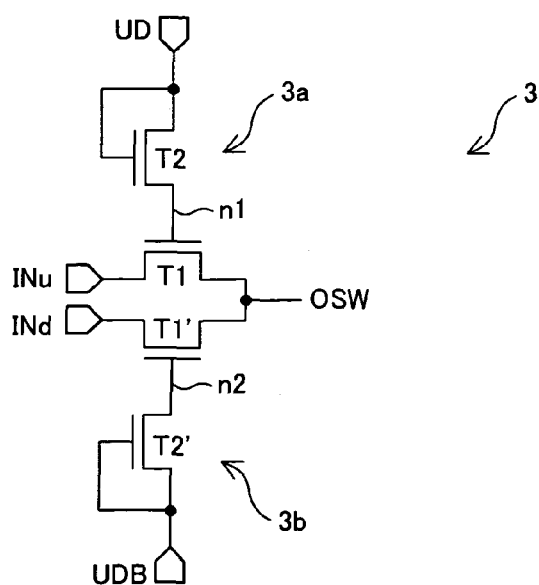
FIG. 20 is a circuit diagram illustrating an arrangement of a scanning direction switching circuit included in the unit circuit shown in FIG. 19.

As illustrated in FIG. 20, the scanning direction switching circuit 3 includes two circuits 10 of the Embodiment 1 (a first circuit 3*a* and a second circuit 3*b*). The first circuit 3*a* includes two transistors T1 and T2, an input terminal INu, a scanning direction switching terminal UD, and an output terminal OUT, and the second circuit 3*b* includes two transistors T1' (eleventh transistor) and T2' (twelfth transistor), an input terminal INd, a scanning direction switching terminal UDB, and an output terminal OUT. A source terminal (second terminal) of the transistor T1 of the first circuit 3*a* and a source terminal (second terminal) of the transistor T1' of the second circuit 3*b* are connected to each other, and are connected to the output terminal OUT. A gate terminal (control terminal) and a drain terminal (first terminal) of the transistor T2 are connected to each other, and a gate terminal (control terminal) and a drain terminal (first terminal) of the transistor T2' are connected to each other. That is, each of the transistors T2 and T2' is a so-called diode connected transistor.

According to the circuit configuration, in a case where the scanning direction switching signal UD has a voltage of high level and the scanning direction switching signal UDB has a voltage of low level, the transistor T1 turns ON and the transistor T1' turns OFF. Thus, the gate terminals of the respective transistors T11 and T17 are electrically connected to the input terminal INu. This allows a first unit circuit 2 to receive an output signal from a second unit circuit 2 which is followed by the first unit circuit 2, thereby causing the shift register 1 to sequentially shift the output signals in a forward direction (from top down in FIG. 18).

Meanwhile, in a case where the scanning direction switching signal UD has a voltage of low level and the scanning direction switching signal UDB has a voltage of high level, the transistor T1 turns OFF and the transistor T1' turns ON. Thus, the gate terminals of the respective transistors T11 and T17 are electrically connected to the input terminal INd. This allows the first unit circuit 2 to receive an output signal from a third unit circuit 2 which follows the first unit circuit 2, thereby causing the shift register 1 to sequentially shift the output signals in a backward direction (from bottom to top in FIG. 18). Note that, in a case where n is an even number, it is necessary that (i) the clock signal CK1 has a high level period of the clock signal CK2 and (ii) the clock signal CK2 has a high level period of the clock signal CK1, in order to shift the output signal in a reverse direction.

As described above, the scanning direction switching circuit 3 outputs, in response to the scanning direction switching signals UD and the UDB, (i) an output signal which is supplied from the second unit circuit 2, which is followed by the first unit circuit 2, to the input terminal INu or (ii) an output signal which is supplied from the third unit circuit 2, which follows the first unit circuit 2, to the input terminal INd. The output signal from the scanning direction switching circuit 3 is supplied to the gate terminals of the respective transistors T11 and T17.

Figure 21:
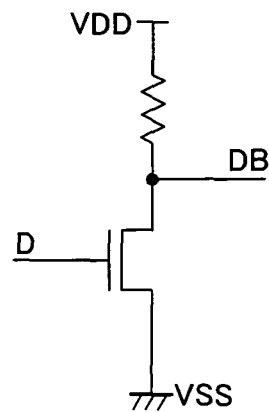
FIG. 21 is a circuit diagram illustrating a circuit configuration of an inversion signal generating circuit.

As illustrated in FIG. 18, the shift register 1 has a circuit configuration in which the unit circuits 2 are connected in cascade and scanning direction switching signals UD and UDB are supplied to each of the unit circuits 2. As such, noise caused by a wiring resistor tends to be mixed in each of the scanning direction switching signals UD and UDB. In a case of an arrangement in which a so-called inversion signal generating circuit generates, in response to a scanning direction switching signal UD, a scanning signal switching signal UDB in a liquid crystal display device, a resistor is used to suppress a through current, as illustrated in FIG. 21. This causes a reduction in driving capability. Therefore, in such an arrangement, noise is more likely to be mixed in a scanning direction switching signal UDB generated in response to a scanning direction switching signal UD.

Figure 22:
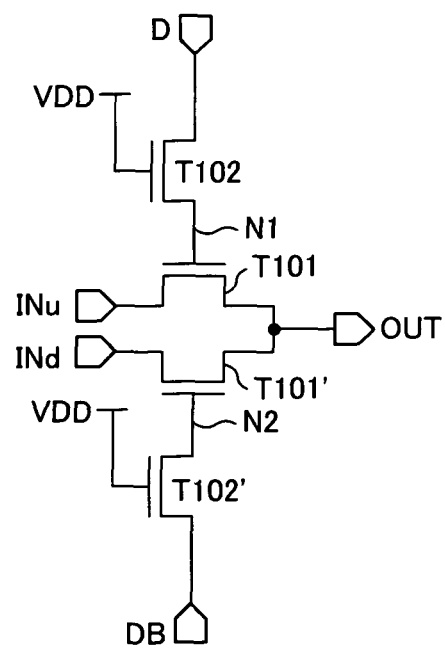
FIG. 22 is a circuit diagram illustrating a circuit configuration of a scanning direction switching circuit constituted by a conventional circuit.
Figure 23:
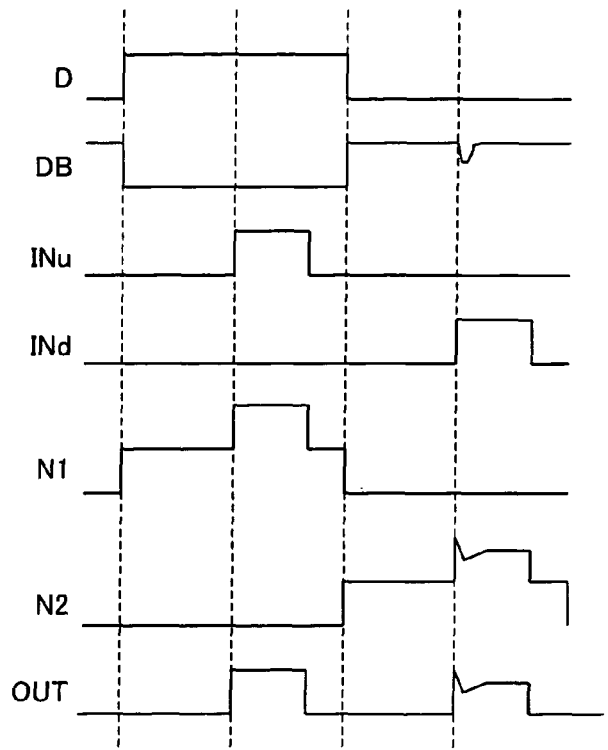
FIG. 23 is a timing chart showing waveforms of respective various signals in the scanning direction switching circuit shown in FIG. 22.
Figure 34:
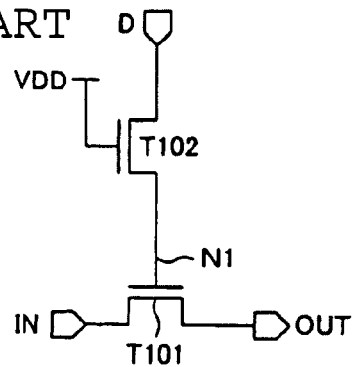
FIG. 34 is a circuit diagram obtained in a case where the conventional switch is constituted by n-channel transistors.
Figure 35:
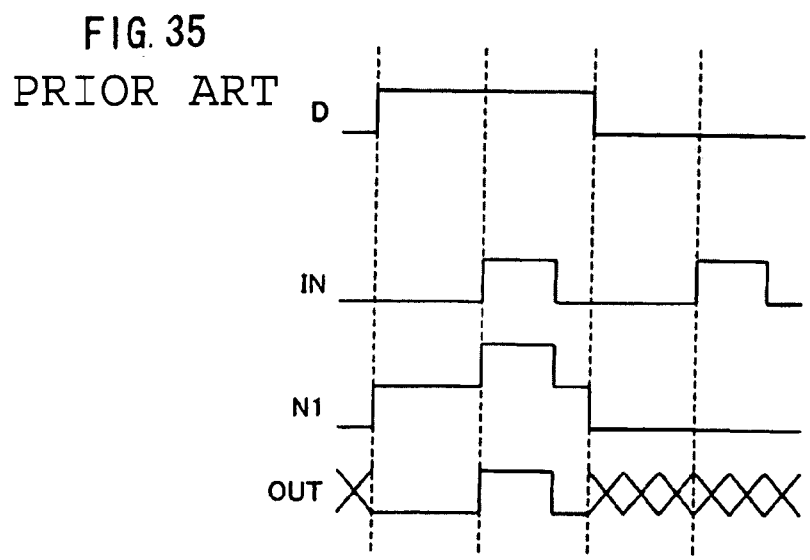
FIG. 35 is a timing chart showing waveforms of respective various signals in the switch, which timing chart is obtained in a case where no influence of noise exists.

FIG. 22 is a circuit diagram illustrating a scanning direction switching circuit constituted by the conventional circuits shown in FIG. 34. FIG. 23 is a timing chart showing waveforms of respective various signals in the scanning direction switching circuit. As illustrated in FIG. 22, a power supply voltage VDD is supplied to a gate terminal of a transistor T102 and to a gate terminal of a transistor T102', a scanning direction switching signal UD is supplied to a drain terminal of the transistor T102, and a scanning direction switching signal UDB is supplied to a drain terminal of the transistor T102'. FIG. 23 shows a state where noise is mixed in the scanning direction switching signal UDB.

According to such a conventional circuit configuration, in a case where noise is mixed in the scanning direction switching signal UDB during a bootstrap operation, a transistor (the transistor T102', in case of FIG. 22), which should turn OFF, turns ON. This causes an electric potential of a node (node N2 in case of FIG. 22) which has been pulled up is pulled down, thereby reducing an output voltage (see OUT of FIG. 23), as described in the "Summary of Invention".

Figure 24:
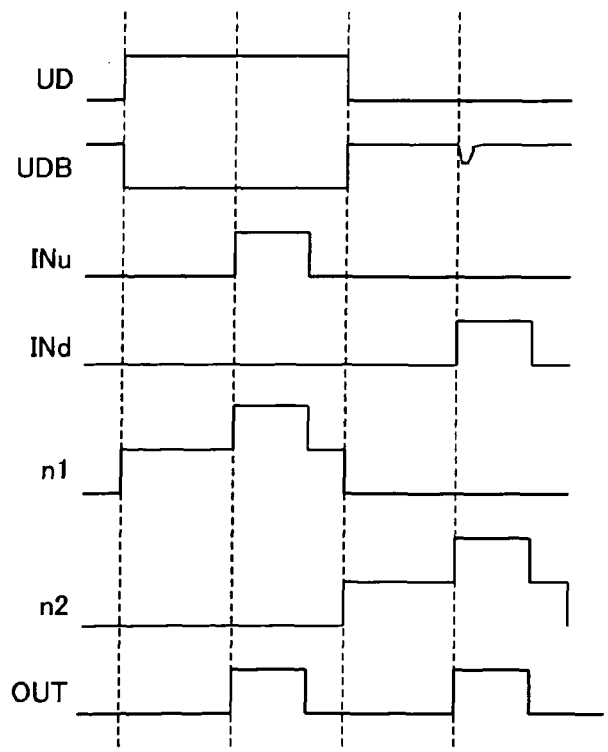
FIG. 24 is a timing chart showing waveforms of respective various signals in the scanning direction switching circuit of the Example 1 that is shown in FIG. 20.

In contrast to this, according to the scanning direction switching circuit 3 of the present Example, the gate terminal and the drain terminal of the transistor T2 are connected to each other, and the gate terminal and the drain terminal of the transistor T2' are connected to each other, as illustrated in FIG. 20. FIG. 24 is a timing chart showing waveforms of respective various signals in the scanning direction switching circuit 3. According to such a circuit configuration, even if the scanning direction switching signal UDB is affected by noise during a bootstrap operation so that potential of the gate terminal of the transistor T2' is pulled down toward a low level, the transistor T2' does not turn ON, unlike the conventional arrangement. This is because there occurs no difference in electric potential between the gate terminal and the drain terminal of the transistor T2'. Since the node n2 is not affected by noise mixed in the scanning direction switching signal UDB, the bootstrap operation is properly carried out and an input signal having an electric potential of VDD is outputted from the output terminal OUT without attenuation.

Figure 25:
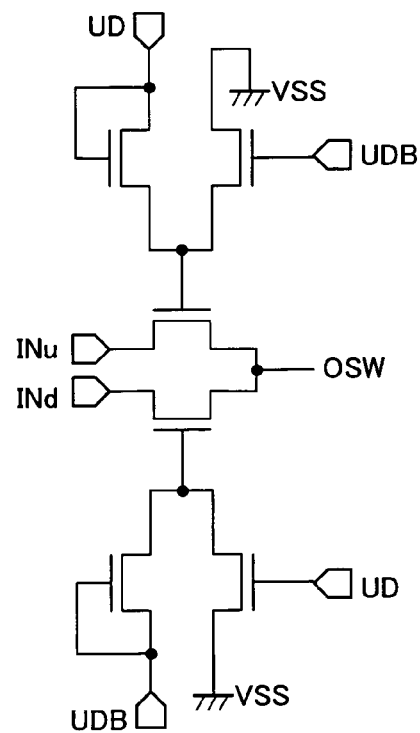
FIG. 25 is a circuit diagram illustrating a circuit configuration of another scanning direction switching circuit of the Example 1.
Figure 26:
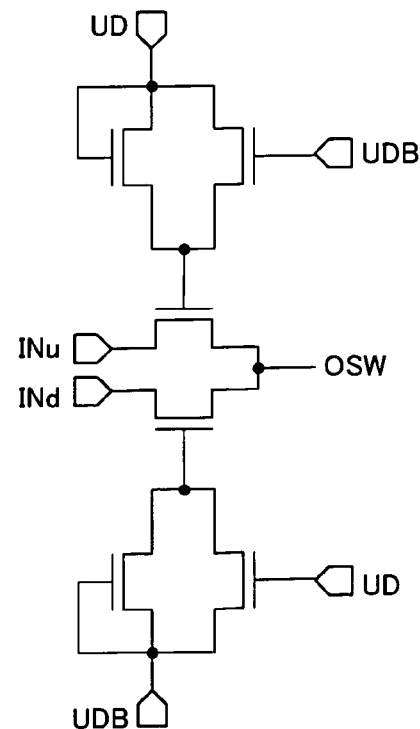
FIG. 26 is a circuit diagram illustrating a circuit configuration of another scanning direction switching circuit of the Example 1.

A circuit configuration of the scanning direction switching circuit 3 which can be applied to the shift register 1 is not limited to the above circuit configuration. Namely, any one of the circuit configurations described in the embodiments can be also applied to the shift register 1. For example, FIG. 25 is a circuit diagram illustrating a circuit configuration in which a scanning direction switching circuit is constituted by the circuit 20 of the Embodiment 2, and FIG. 26 is a circuit diagram illustrating a circuit configuration in which a scanning direction switching circuit is constituted by the circuit 30 of the Embodiment 3.

Figure 27:
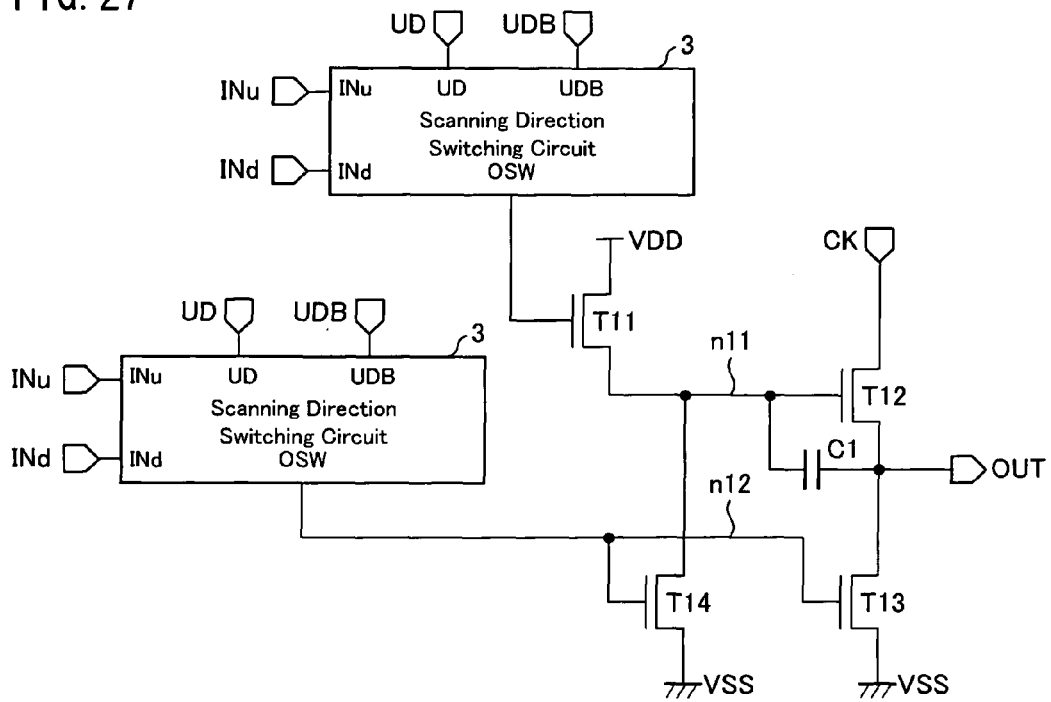
FIG. 27 is a circuit diagram illustrating an arrangement of another shift register of the Example 1.

According to the shift register 1 of the present Example, the reset signal generating circuit 4 is provided and a reset signal is generated within each unit circuit 2 instead of using an output signal supplied from a following unit circuit 2. The present Example is not limited to this. Instead, a reset signal can be generated by using an output signal supplied from a following unit circuit 2. In this circuit configuration, a scanning direction switching circuit 3 is used instead of the reset signal generating circuit 4, as illustrated in FIG. 27.

EXAMPLE 2

Figure 28:
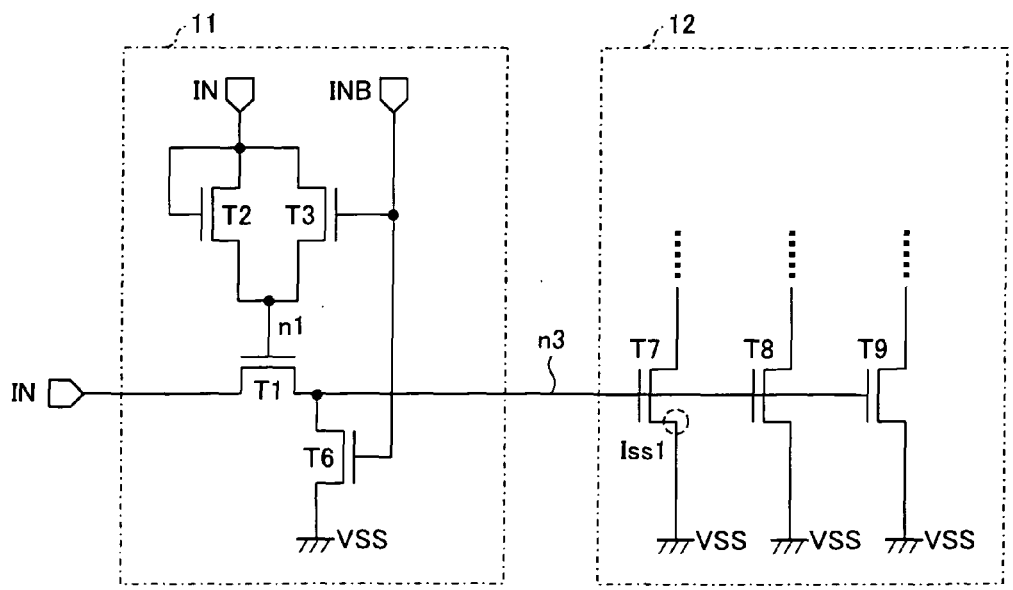
FIG. 28 is a circuit diagram illustrating an arrangement of a buffer and an internal block of the Example 2.
Figure 29:
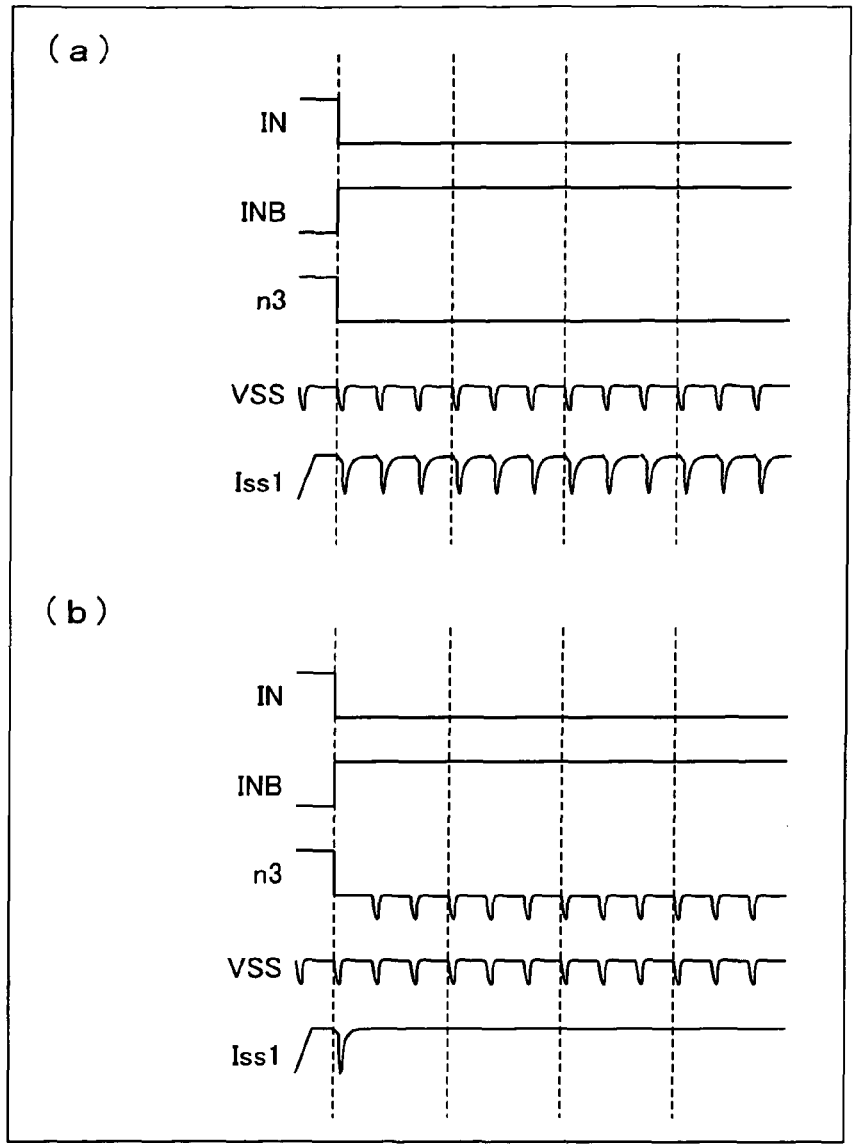
FIG. 29 is a timing chart showing waveforms of respective various signals in the buffer, (a) of FIG. 29 shows waveforms obtained in a case where noise is not mixed in a node n3, and (b) of FIG. 29 shows waveforms in the arrangement of FIG. 28.
Figure 30:
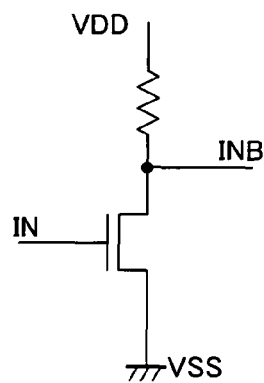
FIG. 30 is a circuit diagram illustrating a circuit configuration of an inversion signal generating circuit.

FIG. 28 is a circuit diagram illustrating a circuit configuration of a buffer 11 of the present Example and an internal block 12 which follows the buffer 11. As illustrated in FIG. 28, an output signal of the buffer 11 is supplied to gate terminals of respective transistors T7 which are provided in cascade, gate terminals of respective transistors T8 which are provided in cascade, and gate terminals of respective transistors T9 which are provided in cascade in the internal block 12. Note that a point at which the buffer 11 and the internal block 12 are connected to each other is hereinafter referred to as "node n3".

The buffer 11 of the present Example is constituted by any one of the circuits described in the embodiments. Further, the buffer 11 further includes a power supply of a voltage VSS and a transistor T6 in order to prevent occurrence of a through current in the internal block 12. The transistor T6 has a drain terminal (first terminal) connected to a source terminal of the transistor T1, a source terminal (second terminal) to which VSS (off voltage) is supplied, and a gate terminal (control terminal) to which an inversion signal INB is supplied.

According to the circuit configuration, for example, in a case where an input signal IN is has a voltage of high level and an inversion signal INB of the input signal IN has a voltage of low level, a VDD signal whose potential does not go below a threshold value is supplied from the buffer 11 to the internal block 12.

Since the input signal IN supplied from an outside of a panel has a high driving capacity, it is more difficult for noise to be mixed in the input signal IN as compared to a VSS signal. On this account, in a case of a circuit configuration where the input signal IN is supplied, as it is, from the transistor T2 while (i) the input signal IN is having a voltage of low level and (ii) the inversion signal INB of the input signal IN is having a voltage of high level, the node n3 keeps to have a voltage of low level without being affected by noise (see the timing chart of FIG. 29 (*a*)). Then, the signal having such a voltage of low level is supplied to the gate terminals of the respective transistors T7, T8, and T9 which constitute the internal block 12. On the other hand, VSS in which noise is easily mixed is supplied to source terminals of the respective transistors T7, T8, and T9. This causes the transistors T7, T8, and T9 to turn. ON, thereby causing a through current to flow a point at which the transistors T7 are connected in cascade, a point at which the transistors T8 are connected in cascade, and a point at which the transistors T9 are connected in cascade (Iss1 in the transistor T7, for example).

In this regard, according to the buffer 11, a power supply voltage VSS, that is identical to a power supply voltage applied to the source terminals of the respective transistors T7, T8, and T9, is supplied to the output terminal of the buffer 11, as illustrated in FIG. 28. This causes the electric potential of the node n3 to be also affected by noise due to the VSS (see the timing chart of (b) of FIG. 29). The electric potential of a signal supplied to the gate terminals of the respective transistors T7, T8, and T9 is thus equal to a power supply voltage supplied to the source terminals of the respective transistors T7, T8, and T9. Therefore, the transistors T7, T8, and T9 will never turn ON while an input signal is having a voltage of low level. It follows that it is possible to prevent occurrence of a through current in the internal block 12.

Note, here, that, since the transistor T6 is configured so as to receive the VSS, the transistor T6 will turn ON if noise is mixed in the VSS while the inversion signal INB is having a voltage of low level. This may cause a through current to flow from the node n3 towards the VSS.

In view of the circumstances, it is preferable that an inversion signal generating circuit (see FIG. 30) which generates an inversion signal INB in the panel is applied to the buffer 11 so that the buffer 11 has a circuit configuration of a single-phase input. With the circuit configuration, VSS in the panel is supplied, as a voltage of low level for the inversion signal INB (L signal), to the gate terminal of the transistor T6. This causes noise, similar to that mixed in the VSS supplied to the source terminal of the transistor T6, to be also mixed in the inversion signal INB. As such, the transistor T6 which turns OFF will never turn ON due to an influence of noise. This allows prevention of occurrence of a through current.

The circuit configuration of the present Example allows a reduction in through current in each of the transistors T7, T8, and T9 of the internal block 12, even in a case where the inversion signal generating circuit is not used, i.e., even in a case where the buffer 11 has a circuit configuration of two-phase input in which both of the input signal IN and the inversion signal INB are supplied. Therefore, even if a through current occurs in the transistor T6, a total through current can be reduced. According to the buffer 11, it is thus possible to reduce a through current regardless of whether the buffer 11 has a circuit configuration of single-phase input or two-phase input.

Figure 31:
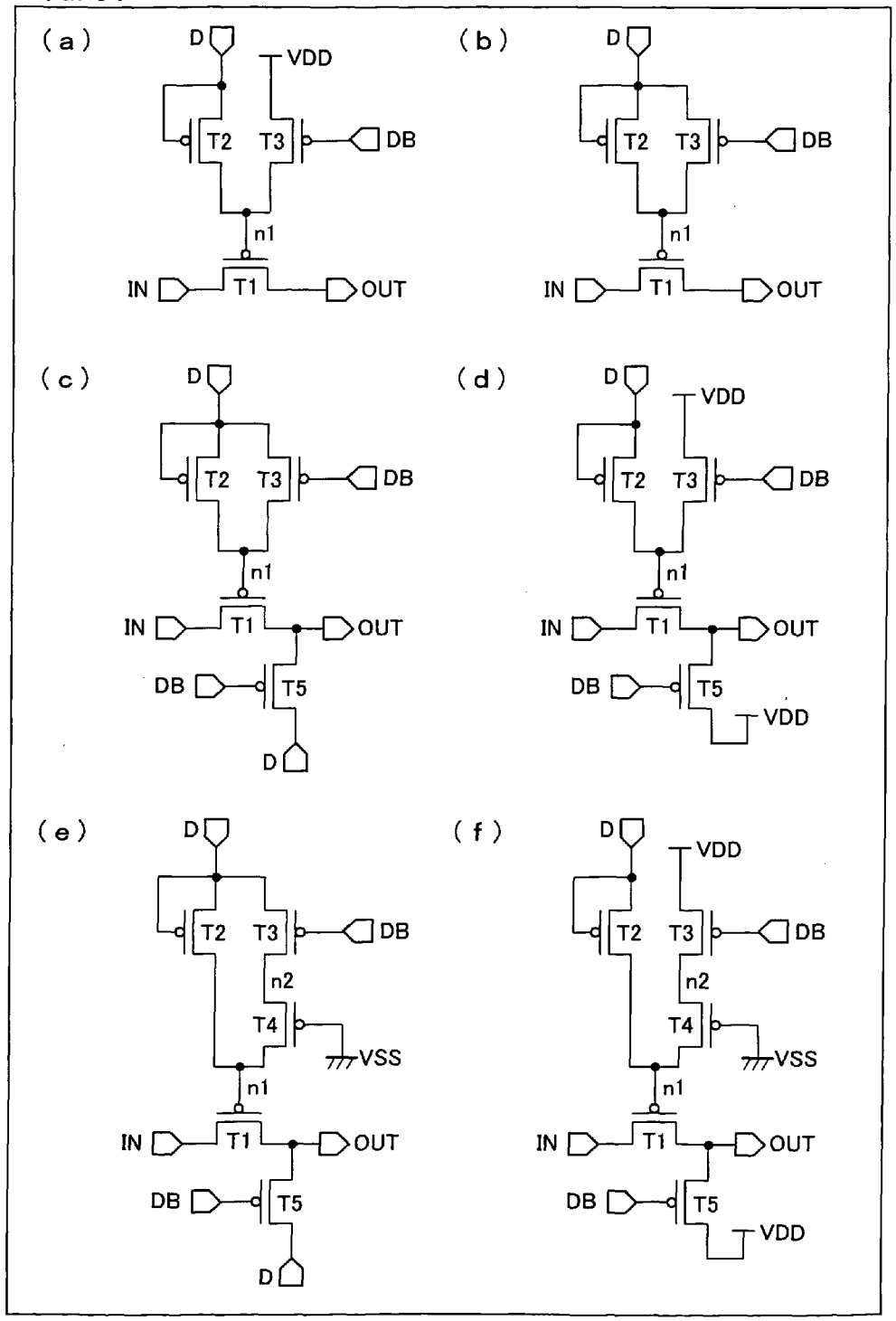
FIG. 31(a) through (f) of FIG. 31 are circuit diagrams obtained in a case where each of the circuits of the respective embodiments is constituted by p-channel transistors.
Figure 32:
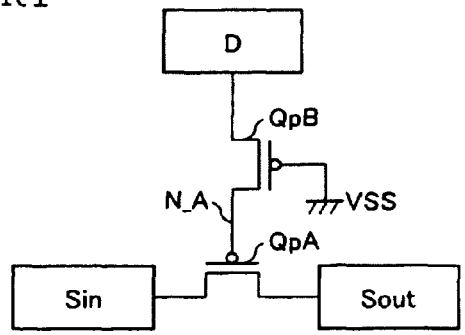
FIG. 32 is a circuit diagram illustrating a switch constituting a conventional shift register.
Figure 33:
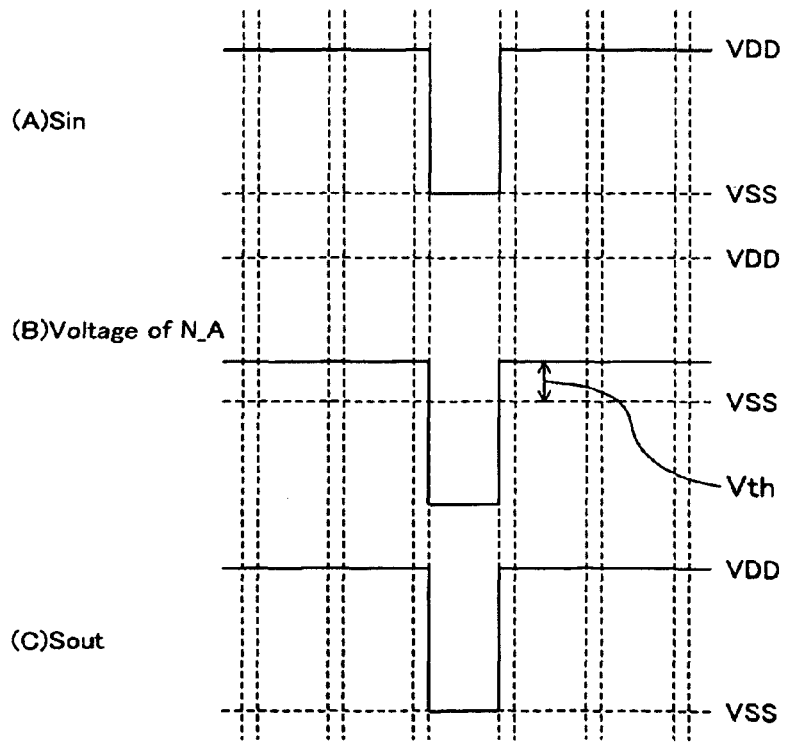
FIG. 33 is a timing chart showing waveforms of respective various signals in the switch shown in FIG. 32.

Finally, the following description deals with examples in which the circuits described in the embodiments are constituted by p-channel transistors. (a) through (f) of FIG. 31 are circuit diagrams respectively illustrating arrangements of circuits 20, 30, 50, 52, 53, and 54, each of which is constituted by p-channel transistors. Such circuit configurations can have the effect of a reduction in influence due to noise.

As described above, a semiconductor device of the present invention is arranged such that a control terminal of a second transistor is connected to a first terminal of the second transistor.

Further, a display device of the present invention includes the semiconductor device.

As such, it is possible to provide (i) a semiconductor device which is constituted by transistors having an identical conductivity type and which is capable of reducing an influence of noise, and (ii) a display device including the semiconductor device.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention is suitably applicable especially to a display device, because the present invention is a circuit that is capable of outputting an inputted signal without causing the input signal to have a reduction in electric potential.

The invention claimed is:

1. A semiconductor device which is constituted by a plurality of transistors having an identical conductivity type, comprising:
   a first transistor which has a first terminal to which an input signal is supplied and a second terminal from which an output signal is outputted;
   a second transistor which has a first terminal to which a control signal is supplied and a second terminal which is connected to a control terminal of the first transistor;
   a fourth transistor which has a first terminal connected to a point at which the control terminal of the first transistor and the second terminal of the second transistor are connected to each other, and a control terminal to which an ON voltage is supplied; and
   a third transistor which has a first terminal connected to a second terminal of the fourth transistor, and a control terminal to which an inversion signal of the control signal is supplied,
   a control terminal of the second transistor, the first terminal of the second transistor, and a second terminal of the third transistor being connected to one another.

* * * * *